US012131955B2

(12) United States Patent
Cheng

(10) Patent No.: US 12,131,955 B2
(45) Date of Patent: Oct. 29, 2024

(54) GATE STRUCTURES FOR SEMICONDUCTOR DEVICES

(71) Applicant: Taiwan Semiconductor Manufacturing Co., Ltd., Hsinchu (TW)

(72) Inventor: Chung-Liang Cheng, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/712,486

(22) Filed: Apr. 4, 2022

(65) Prior Publication Data

US 2022/0223478 A1 Jul. 14, 2022

Related U.S. Application Data

(63) Continuation of application No. 17/035,062, filed on Sep. 28, 2020, now Pat. No. 11,295,989.

(Continued)

(51) Int. Cl.
 *H01L 21/8238* (2006.01)
 *H01L 21/02* (2006.01)
 (Continued)

(52) U.S. Cl.
 CPC ........ *H01L 21/823842* (2013.01); *H01L 21/02244* (2013.01); *H01L 21/02252* (2013.01);
 (Continued)

(58) Field of Classification Search
 CPC ....... H01L 21/823842; H01L 21/02244; H01L 21/02252; H01L 21/02603;
 (Continued)

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

CN 106558547 A 4/2017
CN 106653606 A 5/2017
(Continued)

OTHER PUBLICATIONS

Office Action directed to related Taiwanese Patent Application No. 109143342, dated Oct. 20, 2021; 8 pages.

*Primary Examiner* — Tong-Ho Kim
(74) *Attorney, Agent, or Firm* — Sterne, Kessler, Goldstein & Fox P.L.L.C.

(57) ABSTRACT

A semiconductor device with different configurations of gate structures and a method of fabricating the semiconductor device are disclosed. The semiconductor device includes first and second gate structures disposed on first and second nanostructured channel regions, respectively. The first gate structure includes a nWFM layer disposed on the first nanostructured channel region, a barrier layer disposed on the nWFM layer, a first pWFM layer disposed on the barrier layer, and a first gate fill layer disposed on the first pWFM layer. Sidewalls of the first gate fill layer are in physical contact with the barrier layer. The second gate structure includes a gate dielectric layer disposed on the second nanostructured channel region, a second pWFM layer disposed on the gate dielectric layer, and a second gate fill layer disposed on the pWFM layer. Sidewalls of the second gate fill layer are in physical contact with the gate dielectric layer.

20 Claims, 36 Drawing Sheets

Related U.S. Application Data

(60) Provisional application No. 63/029,861, filed on May 26, 2020.

(51) Int. Cl.

| | |
|---|---|
| *H01L 21/28* | (2006.01) |
| *H01L 27/092* | (2006.01) |
| *H01L 29/06* | (2006.01) |
| *H01L 29/423* | (2006.01) |
| *H01L 29/49* | (2006.01) |
| *H01L 29/66* | (2006.01) |
| *H01L 29/786* | (2006.01) |

(52) U.S. Cl.
CPC .. *H01L 21/02603* (2013.01); *H01L 21/28088* (2013.01); *H01L 21/823807* (2013.01); *H01L 27/092* (2013.01); *H01L 29/0673* (2013.01); *H01L 29/42392* (2013.01); *H01L 29/4908* (2013.01); *H01L 29/66742* (2013.01); *H01L 29/78696* (2013.01)

(58) Field of Classification Search
CPC ....... H01L 21/28088; H01L 21/823807; H01L 27/092; H01L 29/0673; H01L 29/42392; H01L 29/4908; H01L 29/66742; H01L 29/78696; H01L 21/0228; H01L 21/28185; H01L 29/401; H01L 29/513; H01L 29/66439; H01L 29/775; H01L 21/02153; H01L 29/0665; H01L 29/1033; H01L 29/42356; H01L 29/66795; H01L 29/785; H01L 21/823828; H01L 21/823857; B82Y 10/00
USPC ........................................................ 257/351
See application file for complete search history.

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,443,771 B1 | 9/2016 | Shen et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,698,241 B1 | 7/2017 | Patil et al. | |
| 9,997,519 B1 | 6/2018 | Bao et al. | |
| 10,229,986 B1 | 3/2019 | Jagannathan et al. | |
| 10,490,559 B1 | 11/2019 | Ando et al. | |
| 11,295,989 B2 * | 4/2022 | Cheng | H01L 29/513 |
| 2009/0275179 A1 | 11/2009 | Basker et al. | |
| 2011/0248348 A1 | 10/2011 | Gan et al. | |
| 2012/0256276 A1 * | 10/2012 | Hwang | H01L 21/823842 |
| | | | 257/E21.295 |
| 2013/0299914 A1 | 11/2013 | Kim | |
| 2013/0302980 A1 | 11/2013 | Chandrashekar et al. | |
| 2014/0299939 A1 * | 10/2014 | Kim | H01L 29/0847 |
| | | | 257/369 |
| 2015/0145057 A1 | 5/2015 | Fan et al. | |
| 2015/0206963 A1 | 7/2015 | Ho et al. | |
| 2015/0311208 A1 | 10/2015 | Kim | |
| 2016/0020118 A1 | 1/2016 | Park et al. | |
| 2016/0181390 A1 | 6/2016 | Liu et al. | |
| 2017/0018462 A1 | 1/2017 | Suk et al. | |
| 2017/0221889 A1 | 8/2017 | Dasgupta et al. | |
| 2018/0175165 A1 * | 6/2018 | Lim | H01L 29/66583 |
| 2018/0315652 A1 * | 11/2018 | Tsai | H01L 29/66545 |
| 2018/0358448 A1 | 12/2018 | Chiang et al. | |
| 2018/0374926 A1 | 12/2018 | Lee et al. | |
| 2019/0273145 A1 | 9/2019 | Chiu et al. | |
| 2020/0044073 A1 | 2/2020 | Huang et al. | |
| 2020/0098643 A1 | 3/2020 | Cheng et al. | |
| 2020/0105623 A1 | 4/2020 | Chu et al. | |
| 2021/0375698 A1 | 12/2021 | Cheng et al. | |

FOREIGN PATENT DOCUMENTS

| | | |
|---|---|---|
| CN | 106981488 A | 7/2017 |
| CN | 107546179 A | 1/2018 |
| CN | 107887428 A | 4/2018 |
| CN | 109427873 A | 3/2019 |
| CN | 110197828 A | 9/2019 |
| KR | 1020130127257 A | 11/2013 |
| KR | 20140142957 | 12/2014 |
| KR | 20160011019 A | 1/2016 |
| KR | 1020170009678 A | 1/2017 |
| TW | 201405781 A | 2/2014 |

* cited by examiner

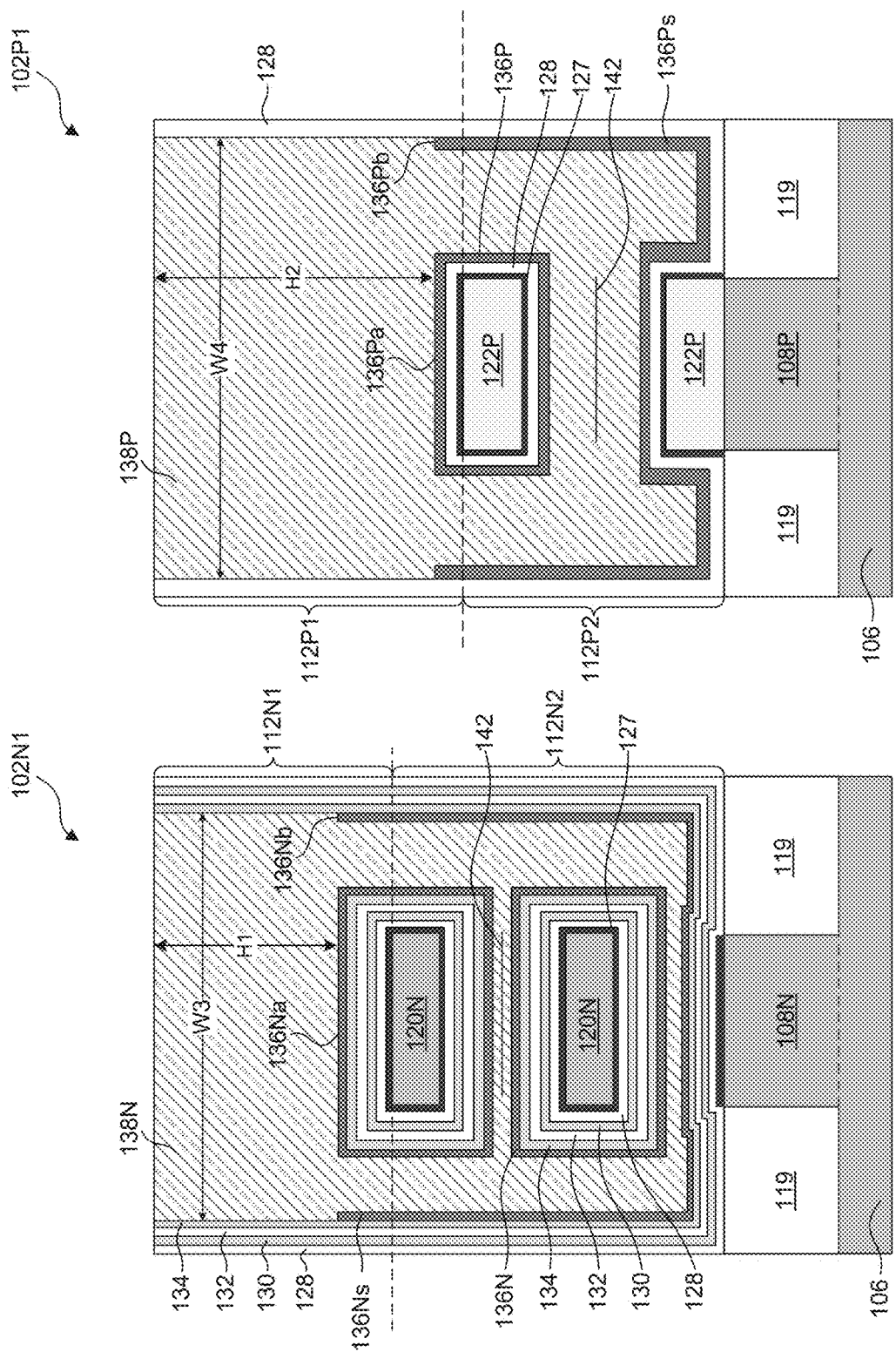

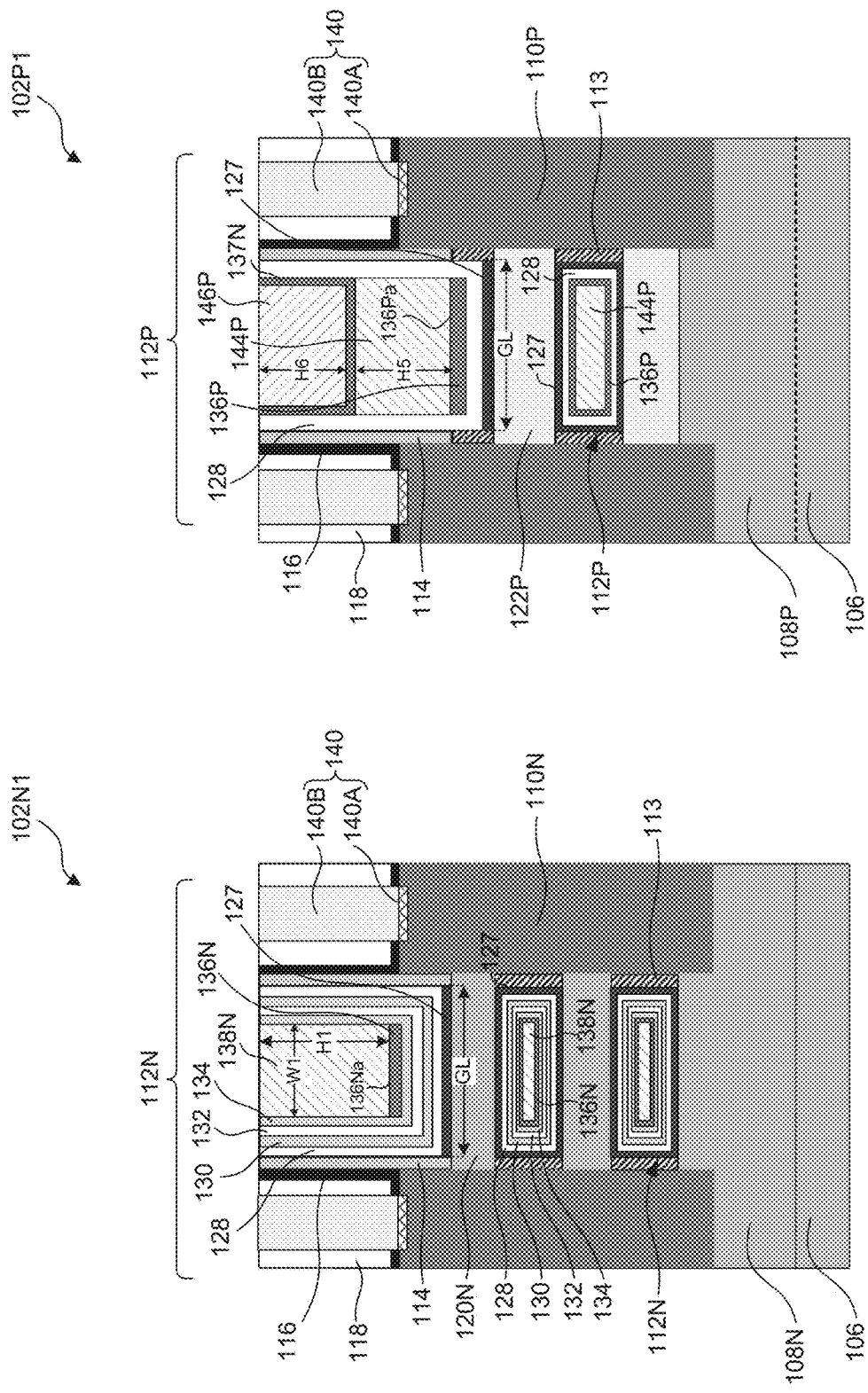

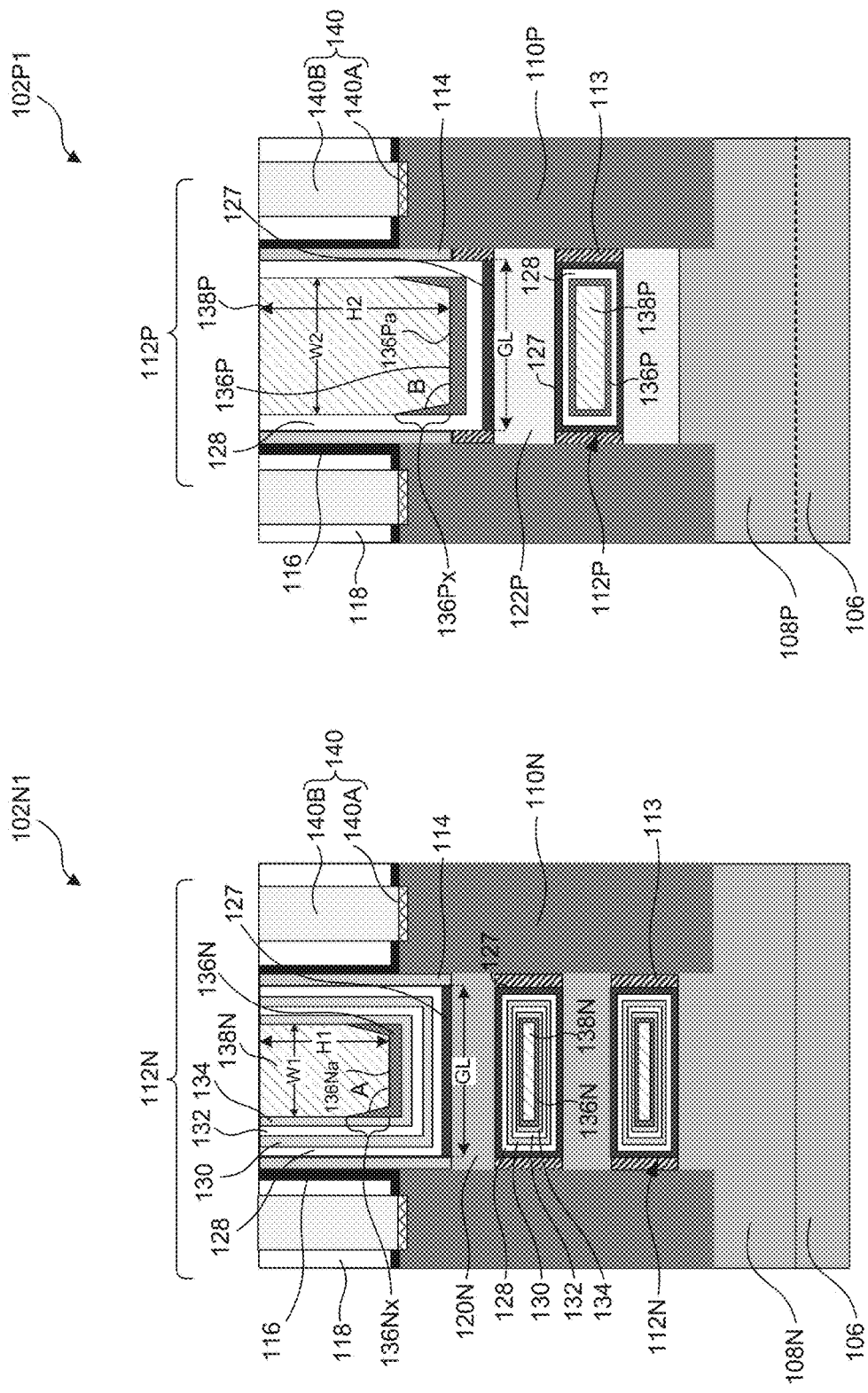

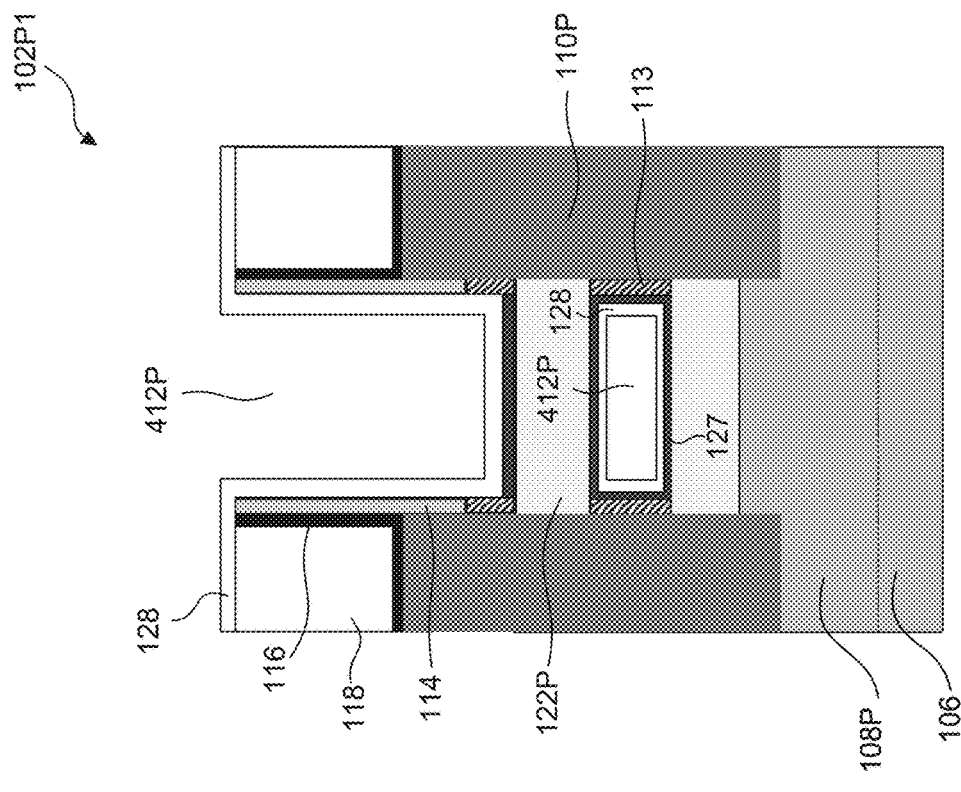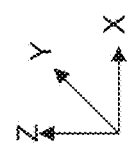
Fig. 11B
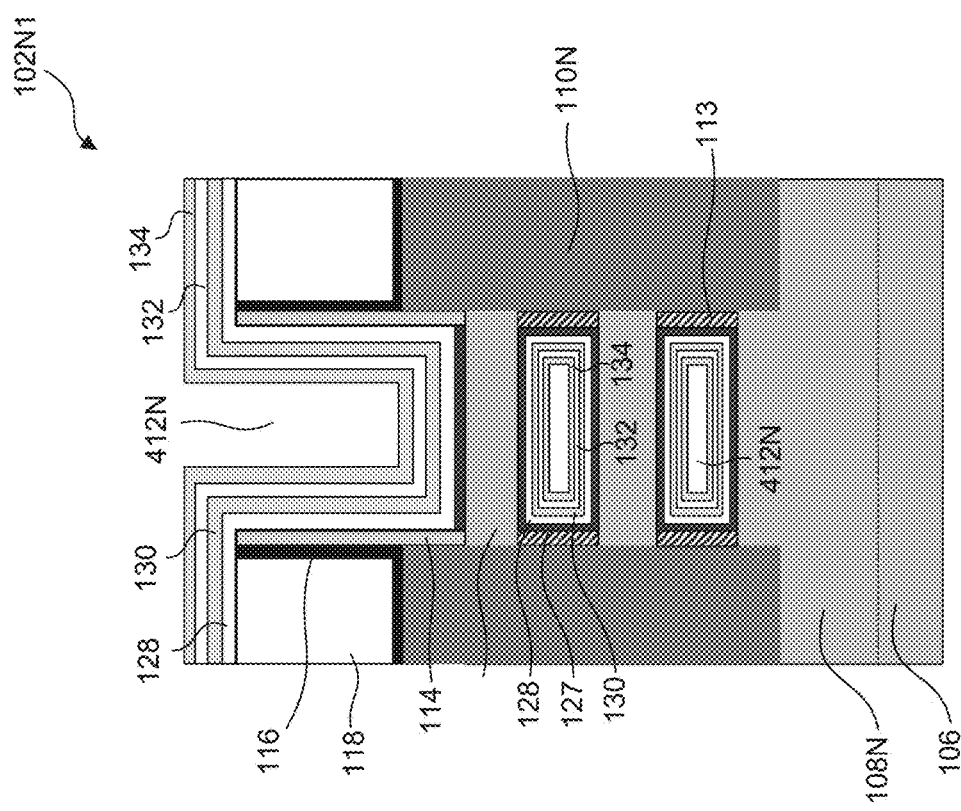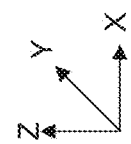
Fig. 11A

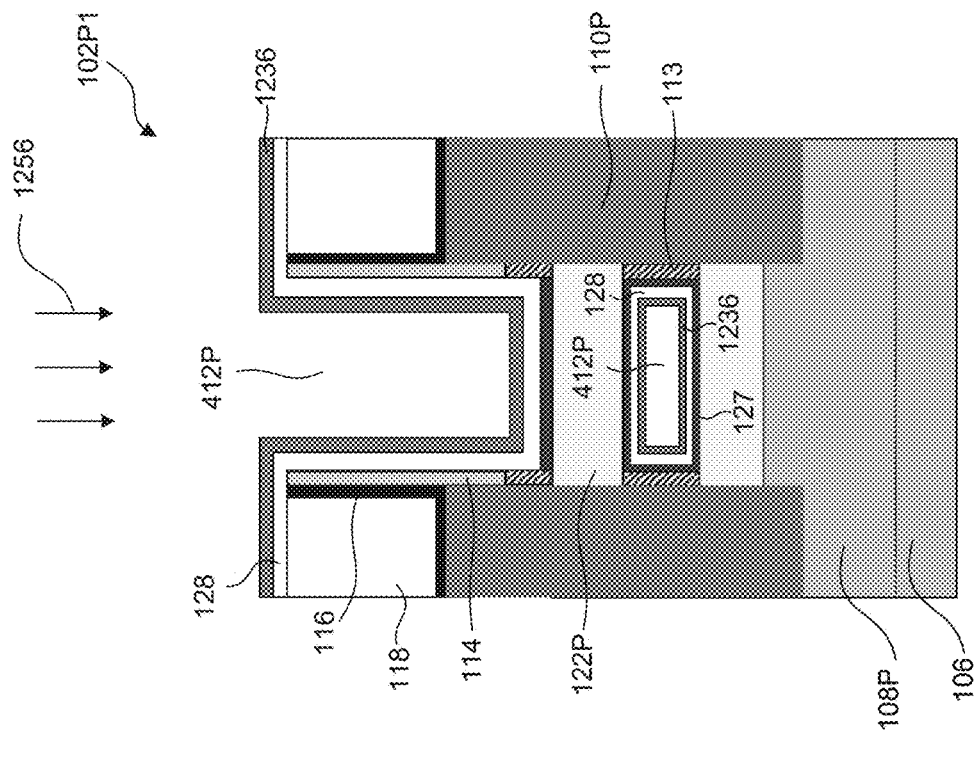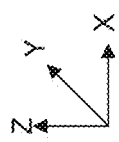
Fig. 12A
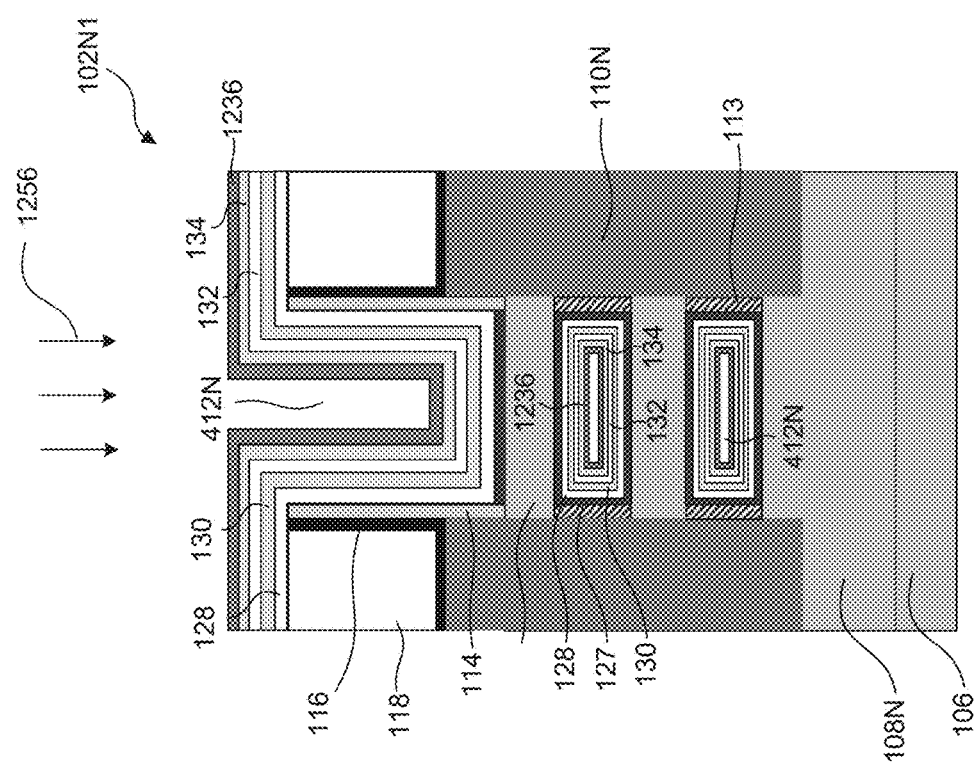
Fig. 12B

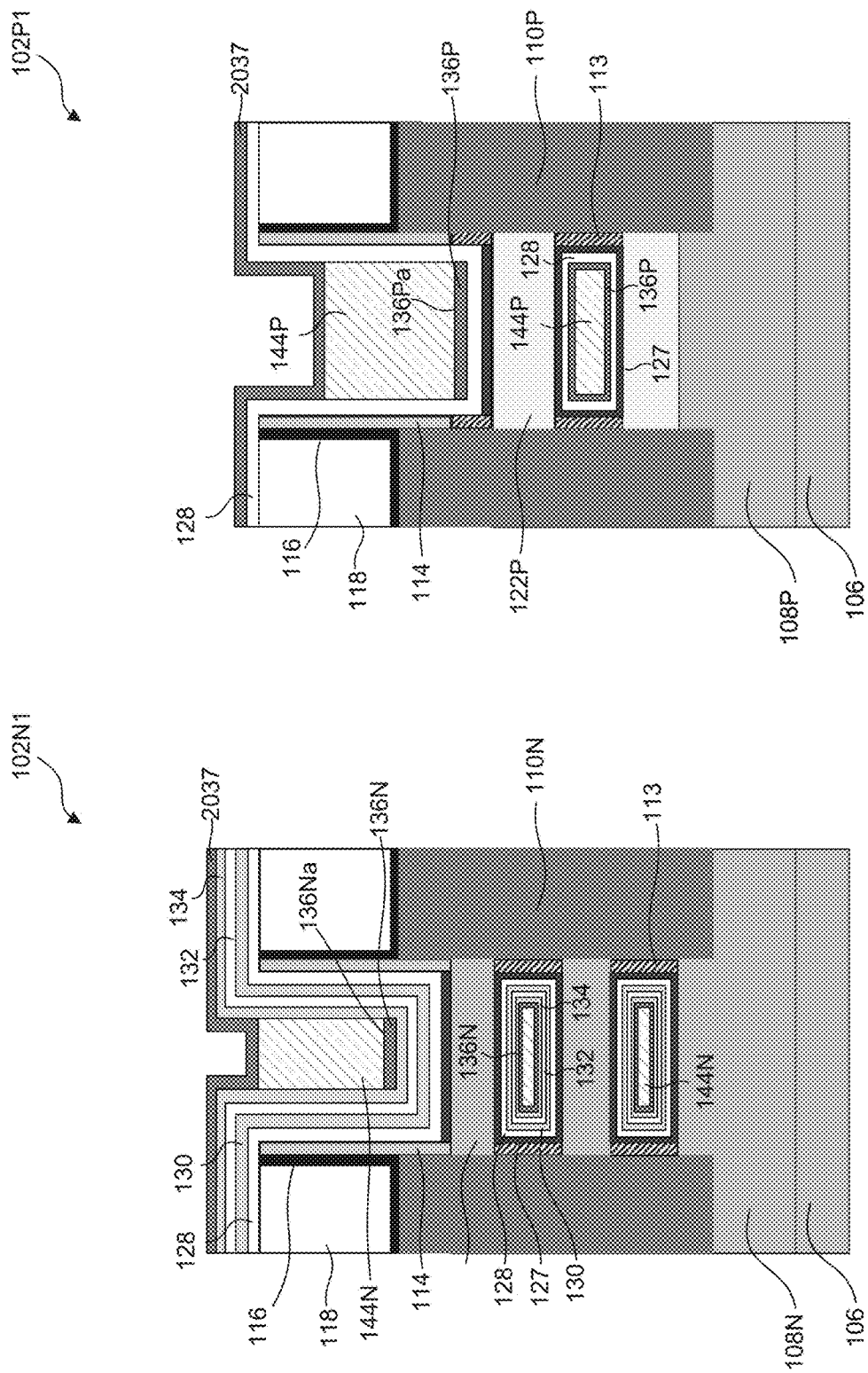

GATE STRUCTURES FOR SEMICONDUCTOR DEVICES

CROSS-REFERENCE TO RELATED APPLICATIONS

This application is a continuation of U.S. patent application Ser. No. 17/035,062, titled "Gate Structures for Semiconductor Devices," filed Sep. 28, 2020, which claims the benefit of U.S. Provisional Patent Application No. 63/029,861, titled "Semiconductor Device and Method for Forming the Same," filed May 26, 2020, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 3A-26B illustrate cross-sectional views of a semiconductor device with different gate structure configurations at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
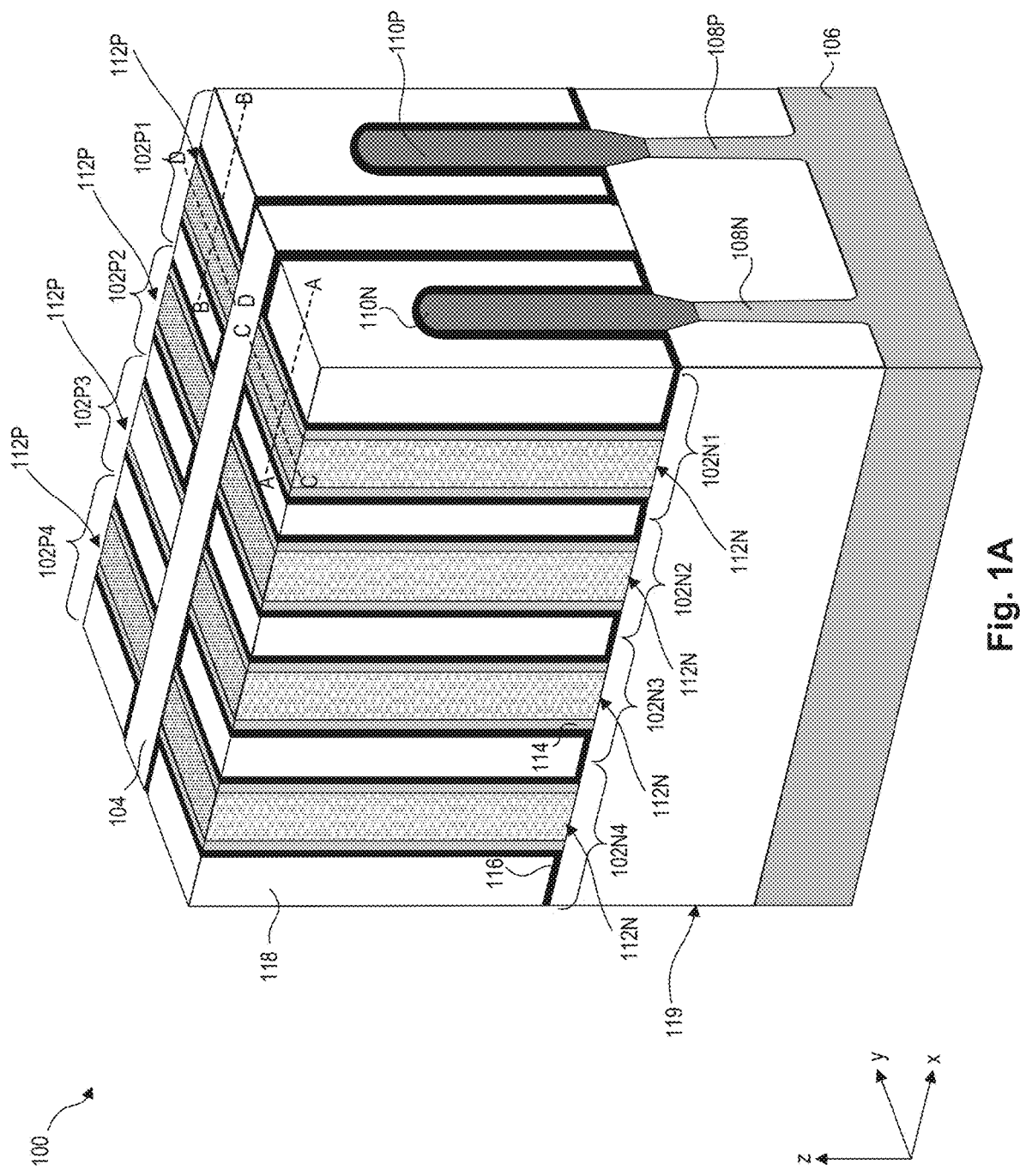
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage (Vt)— to turn on a field effect transistor (FET) can depend on the semiconductor material of the FET channel region and/or the effective work function (EWF) value of a gate structure of the FET. For example, for an n-type FET (NFET), reducing the difference between the EWF value(s) of the NFET gate structure and the conduction band energy of the material (e.g., 4.1 eV for Si or 3.8 eV for SiGe) of the NFET channel region can reduce the NFET threshold voltage. For a p-type FET (PFET), reducing the difference between the EWF value(s) of the PFET gate structure and the valence band energy of the material (e.g., 5.2 eV for Si or 4.8 eV for SiGe) of the PFET channel region can reduce the PFET threshold voltage. The EWF values of the FET gate structures can depend on the thickness and/or material composition of each of the layers of the FET gate structure. Accordingly, FETs can be manufactured with different threshold voltages by adjusting the thickness and/or material composition of the FET gate structures.

Due to the increasing demand for low power portable devices, there is an increasing demand for FETs with low threshold voltages, such as threshold voltages lower than 100 mV (also referred to as "ultra-low threshold voltage"). One way to achieve such ultra-low threshold voltage in FETs can be by using work function metal (WFM) layer(s) with thickness greater than about 4 nm (e.g., about 5 nm to about 10 nm) in the FET gate structures. However, increasing the thickness of the WFM layer(s) can decrease the volume area for the gate metal fill layers of the FET gate structures, and consequently increase the FET gate resistance.

The present disclosure provides example multi-threshold voltage (multi-Vt) devices with FETs (e.g., finFETs or GAA FETs) having different gate structure configurations that provide ultra-low threshold voltages different from each other without increasing gate resistance. The present disclosure also provides example methods of forming such FETs on a same substrate. The example methods form FETs of different conductivity types with different EWF values, and as a result, with different and/or ultra-low threshold voltages on the same substrate. These example methods can be more cost-effective (e.g., cost reduced by about 20% to about 30%) and time-efficient (e.g., time reduced by about 15% to about 20%) in manufacturing reliable gate structures in FETs with ultra-low threshold voltages than other methods of forming FETs with similar gate structure dimensions and threshold voltages on the same substrate. In addition, these example methods can form FET gate structures with smaller dimensions (e.g., smaller gate length) without increasing gate resistance than other methods of forming FETs with similar gate structure dimensions and threshold voltages. For example, using these example methods, the gate resistance can be reduced by about 50% to about 75% compared to the gate resistance of gate structures formed with similar gate structure dimensions and threshold voltages using the other methods.

In some embodiments, NFETs and PFETs with different gate structure configurations can be selectively formed on the same substrate. To achieve NFETs and PFETs with ultra-low threshold voltages, NFETs can include Al-based n-type WFM (nWFM) layers and PFETs can include substantially Al-free (e.g., with no Al) p-type WFM (pWFM) layers. The WFM layers can be in physical contact with gate dielectric layers of the NFETs and PFETs. In some embodiments, the nWFM layers can include Al-based titanium (Ti) or tantalum (Ta) alloys and the pWFM layers can include substantially Al-free (e.g., with no Al) Ti or Ta nitrides or alloys. In some embodiments, the pWFM layers can be used as WFM layers for the PFETs and also as glue layers for both the NFETs and PFETs to reduce the number of layers in the gate structures and consequently increase the volume area for gate metal fill layers, which are formed on the glue layers. In some embodiments, the volume area for the gate metal fill layers can be further increased by removing the pWFM layers from the sidewalls of gate openings in which the gate metal fill layers are subsequently formed. Thus, the selective formation of the pWFM layers at the bottom of the NFET and PFET gate openings can form gate structures with ultra-low threshold voltages without increasing the gate resistance.

Figures 1B, 1C:
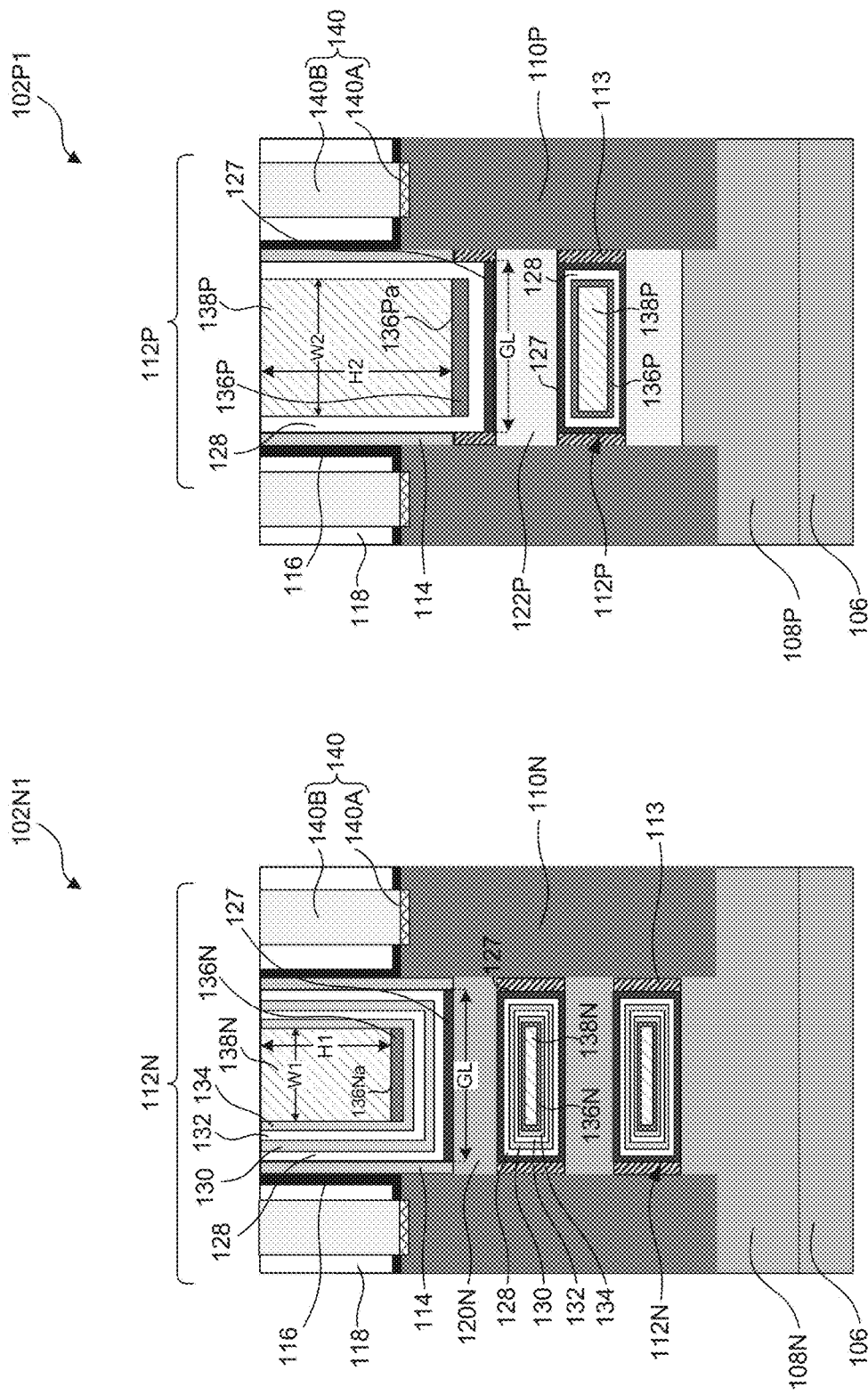
FIGS. 1B-1S illustrate cross-sectional views of a semiconductor device with different gate structure configurations, in accordance with some embodiments.
Figures 1F, 1G:
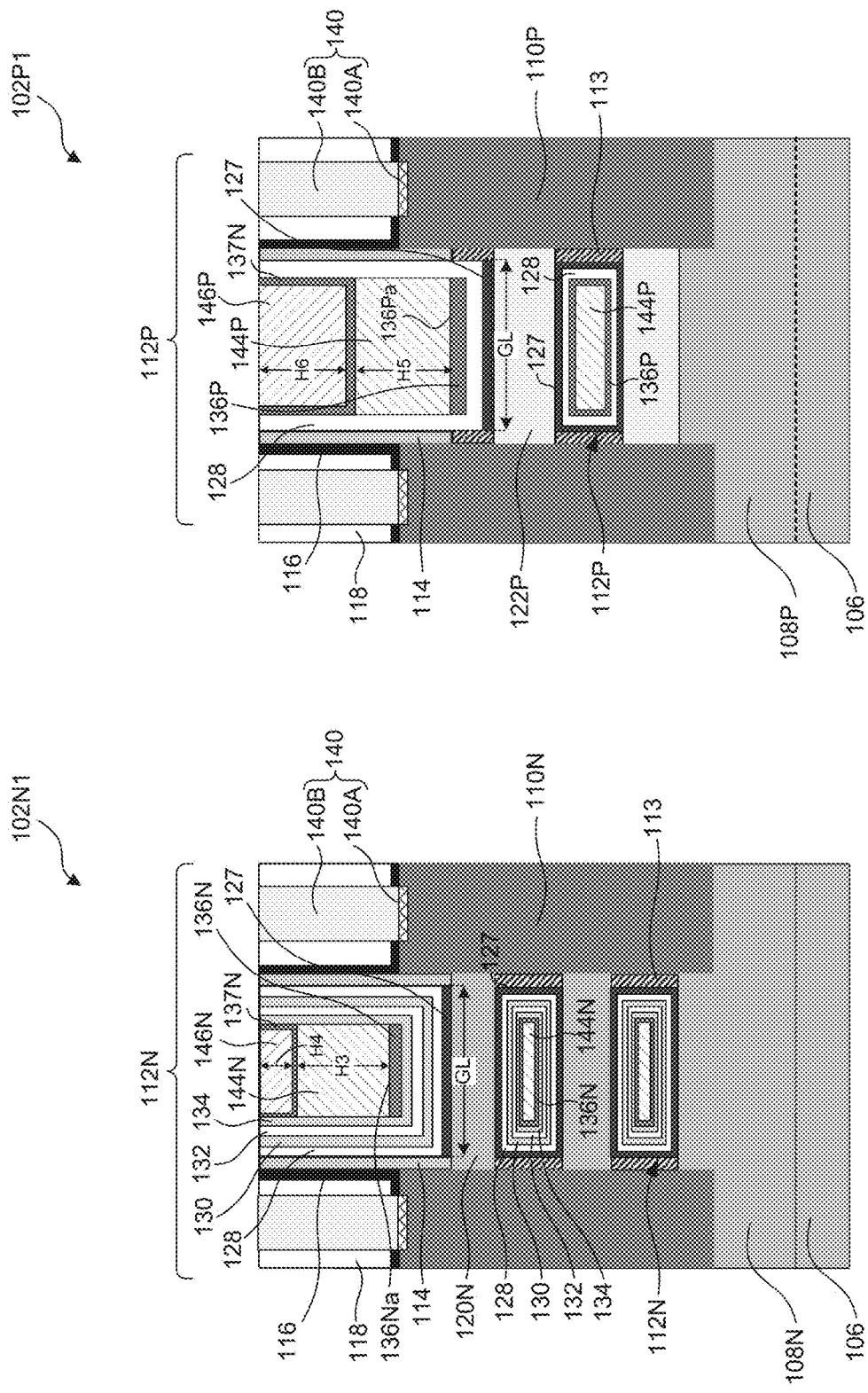
Figures 1H, 1I:
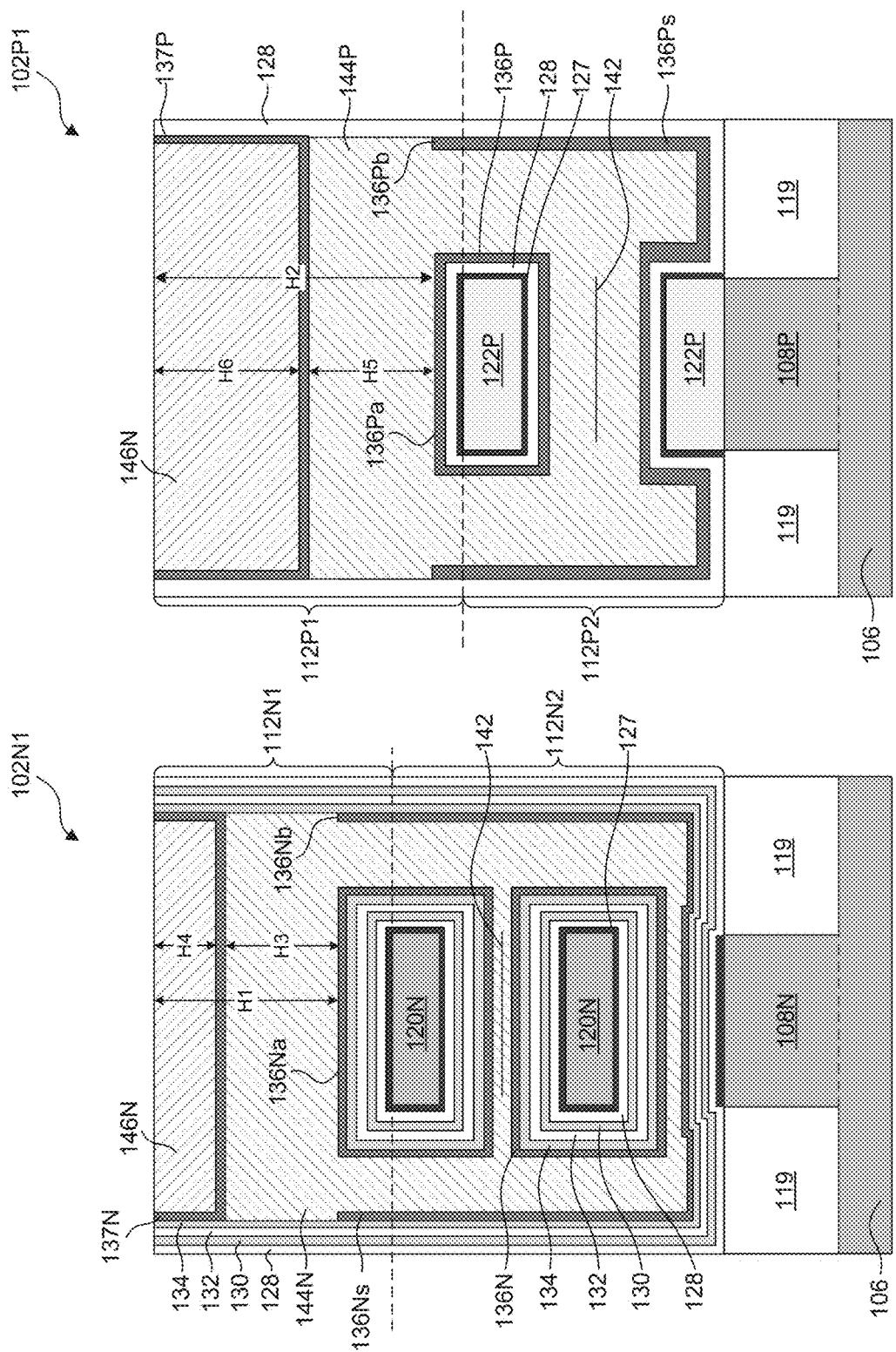
Figures 1N, 1O:
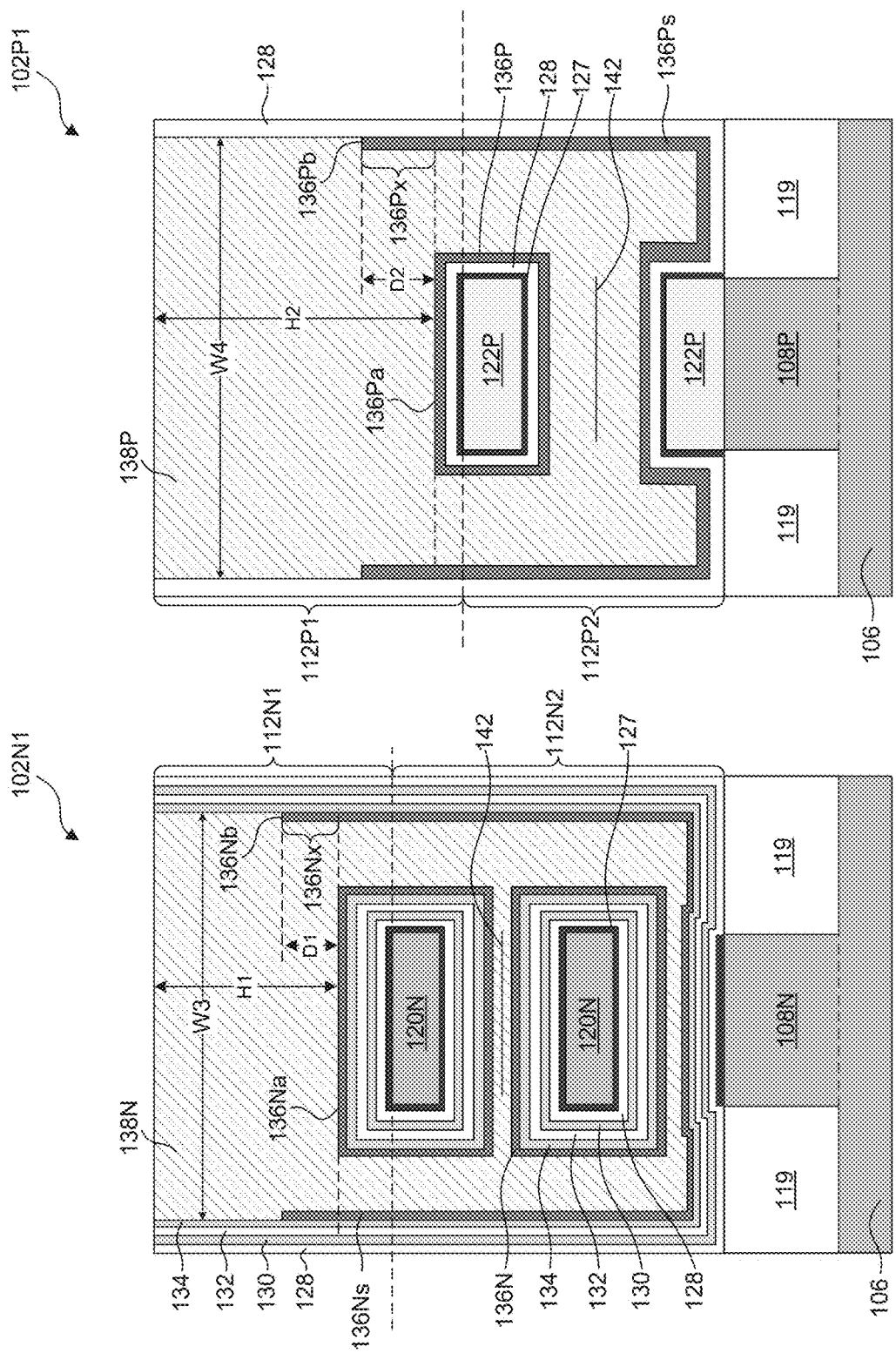

A semiconductor device 100 with NFETs 102N1-102N4 and PFETs 102P1-102P4 is described with reference to FIGS. 1A-1S, according to various embodiments. FIG. 1A illustrates an isometric view of semiconductor device 100, according to some embodiments. Semiconductor device 100 can have different cross-sectional views as illustrated with FIGS. 1B-1S. The cross-sectional views in FIGS. 1B-1S illustrate semiconductor device 100 with additional structures that are not shown in FIG. 1A for simplicity. FIGS. 1B, 1F, 1J, 1L, 1P, and 1R illustrate different cross-sectional views along line A-A of FIG. 1A, according to various embodiments. FIGS. 1C, 1G, 1K, 1M, 1Q, and 1S illustrate different cross-sectional views along line B-B of FIG. 1A, according to various embodiments. FIGS. 1D, 1H, and 1N illustrate different cross-sectional views along line C-C of FIG. 1A, according to various embodiments. FIGS. 1E, 1I, and 1O illustrate different cross-sectional views along line D-D of FIG. 1A, according to various embodiments. The discussion of elements of NFET 102N1 and PFET 102P1 in FIGS. 1A-1S with the same annotations applies to each other, unless mentioned otherwise. The discussion of NFET 102N1 applies to NFETs 102N2-102N4 and the discussion of PFET 102P1 applies to 102P2-102P4, unless mentioned otherwise.

Semiconductor device 100 can be formed on a substrate 106. Substrate 106 can be a semiconductor material, such as silicon, germanium (Ge), silicon germanium (SiGe), a silicon-on-insulator (SOI) structure, and a combination thereof, or other suitable materials. Further, substrate 106 can be doped with p-type dopants (e.g., boron, indium, aluminum, or gallium) or n-type dopants (e.g., phosphorus or arsenic).

Semiconductor device 100 can further include isolation structure 104, etch stop layer (ESL) 116, interlayer dielectric (ILD) layer 118, and shallow trench isolation (STI) regions 119. Isolation structure 104 can electrically isolate NFETs 102N1-102N4 and PFETs 102P1-102P4 from each other. ESL 116 can be configured to protect gate structures 112N-112P and/or epitaxial source/drain (S/D) regions 110N-110P. In some embodiments, isolation structure 104 and ESL 116 can include an insulating material, such as silicon oxide ($SiO_2$), silicon nitride (SiN), silicon carbon nitride (SiCN), silicon oxycarbon nitride (SiOCN), and silicon germanium oxide or other suitable insulating materials. ILD layer 118 can be disposed on ESL 116 and can include a dielectric material.

Referring to FIGS. 1A-1E, in some embodiments, NFET 102N1 and PFET 102P1 can include (i) fin structures 108N and 108P, (ii) stacks of nanostructured channel regions 120N and 122P disposed on respective fin structures 108N and 108P, (iii) gate structures 112N and 112P disposed on and wrapped around respective nanostructured channel regions 120N and 122P, (iv) epitaxial S/D regions 110N and 110P disposed on portions of respective fin structures 108N and 108P that are adjacent to respective nanostructured channel regions 120N and 122P, (v) S/D contact structures 140 disposed on epitaxial S/D regions 110N and 110P. As used herein, the term "nanostructured" defines a structure, layer, and/or region as having a horizontal dimension (e.g., along an X- and/or Y-axis) and/or a vertical dimension (e.g., along a Z-axis) less than, for example, 100 nm. In some embodiments, NFET 102N1 and PFET 102P1 can be finFETs and have fin regions (not shown) instead of nanostructures channel regions 120N and 122P. Such finFETs 102N1-102P1 can have gate structures 112N-112P disposed on the fin regions.

Fin structures 108N-108P can be formed from substrate 106 and can extend along an X-axis. Nanostructured channel regions 120N and 122P can include semiconductor materials similar to or different from substrate 106 and can include semiconductor material similar to or different from each other. In some embodiments, nanostructured channel regions 120N can include Si, silicon arsenic (SiAs), silicon phosphide (SiP), silicon carbide (SiC), silicon carbon phosphide (SiCP), or other suitable semiconductor materials. Nanostructured channel regions 122P can include SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 120N and 122P are shown, nanostructured channel regions 120N and 122P can have cross-sections of other geometric shapes (e.g., circular, elliptical, triangular, or polygonal).

Epitaxial S/D regions 110N-110P can be grown on respective fin structures 108N-108P and can include epitaxially-grown semiconductor materials similar to or different from each other. In some embodiments, the epitaxially-grown semiconductor material can include the same material or a different material from the material of substrate 106. Epitaxial S/D regions 110N and 110P can be n- and p-type, respectively. As used herein, the term "p-type" defines a structure, layer, and/or region as being doped with p-type dopants, such as boron. As used herein, the term "n-type" defines a structure, layer, and/or region as being doped with n-type dopants, such as phosphorus. In some embodiments, S/D regions 110N can include SiAs, SiC, or SiCP and S/D regions 110P can include SiGe, SiGeB, GeB, SiGeSnB, a III-V semiconductor compound, a combination thereof, or any other suitable semiconductor material.

In some embodiments, each of S/D contact structures 140 on epitaxial S/D regions 110N and 110P can include (i) a silicide layer 140A and (ii) a contact plug 140B disposed on silicide layer 140A. In some embodiments, silicide layers 140A can include nickel silicide (NiSi), tungsten silicide ($WSi_2$), titanium silicide ($TiSi_2$), cobalt silicide ($CoSi_2$), or other suitable metal silicides. In some embodiments, contact plugs 140B can include conductive materials, such as cobalt (Co), tungsten (W), ruthenium (Ru), iridium (Ir), nickel (Ni), Osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof, or other suitable conductive materials.

Referring to FIGS. 1B-1E, gate structures 112N-112P can be multi-layered structures and can surround nanostructured channel regions 120N-120P, respectively, for which gate structures 112N-112P can be referred to as "gate-all-around (GAA) structures" or "horizontal gate-all-around (HGAA) structures." NFET 102N1 and PFET 102P1 can be referred to as "GAA FET 102N1 and GAA FET 102P1" or "GAA NFET 102N1 and GAA PFET 102P1." Gate portions 112N1-112P1 of gate structures 112N-112P surrounding nanostructured channel regions 120N-122P can be electrically isolated from adjacent S/D regions 110N-110P by inner spacers 113. Gate portions 112N2-112P2 of gate structures 112N-112P disposed on the stacks of nanostructured channel regions 120N-122P can be electrically isolated from adjacent S/D regions 110N-110P by gate spacers 114. Inner spacers 113 and gate spacers 114 can include an insulating material, such as $SiO_2$, SiN, SiCN, and SiOCN or other suitable insulating materials.

In some embodiments, gate lengths GL of gate structures 112N-112P are substantially equal to each to other. Gate structures 112N-112P can include (i) interfacial oxide (IO) layers 127, (ii) high-k (HK) gate dielectric layers 128, (iii) glue layers 136N-136P, and (iv) gate metal fill layers 138N-138P. Gate structure 112N can further include (i) nWFM layer 130, (ii) adhesion layer 132, and (iii) oxygen barrier layer 134. Though FIGS. 1B-1E show that all the layers of gate structures 112N are wrapped around nanostructured channel regions 120N, nanostructured channel regions 120N can be wrapped around by at least IO layers 127 and HK gate dielectric layers 128 to fill the spaces between adjacent nanostructured channel regions 120N. Accordingly, nanostructured channel regions 120N can be electrically isolated from each other to prevent shorting between gate structure 112N and S/D regions 110N during operation of NFET 102N1. Similarly, nanostructured channel regions 122P can be wrapped around by at least IO layers 127 and HK gate dielectric layers 128P to electrically isolated nanostructured channel regions 122P from each other to prevent shorting between gate structure 112P and S/D regions 110P during operation of PFET 102P1.

IO layers 127 can be disposed on nanostructured channel regions 120N-122P. In some embodiments, IO layers 127 can include $SiO_2$, silicon germanium oxide ($SiGeO_x$), germanium oxide ($GeO_x$), or other suitable oxide materials. HK gate dielectric layers 128 can be disposed on IO layers 127 and can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) a combination thereof, or (iv) other suitable high-k dielectric materials. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

In some embodiments, nWFM layer 130 can be selectively formed on HK gate dielectric layer 128 of NFET 102N1 and can include a metallic material with a work function value closer to a conduction band energy than a valence band energy of a material of nanostructured channel regions 120N. For example, nWFM layer 130 can include an Al-based or Al-doped metallic material with a work function value less than 4.5 eV (e.g., about 3.5 eV to about 4.4 eV), which can be closer to the conduction band energy (e.g., 4.1 eV of Si or 3.8 eV of SiGe) than the valence band energy (e.g., 5.2 eV of Si or 4.8 eV of SiGe) of Si-based or SiGe-based nanostructured channel regions 120N. In some embodiments, nWFM layer 130 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, a combination thereof, or other suitable Al-based materials. In some embodiments, nWFM layer 130 can include a thickness ranging from about 1 nm to about 3 nm. The thickness within this range can allow nWFM layer 130 to be wrapped around nanostructured channel regions 120N for ultra-low threshold voltage of NFET 102N1 without being constrained by the spacing between adjacent nanostructured channel regions 120N.

Adhesion layer 132 can be selectively formed on nWFM layer 130 and can provide adhesion between nWFM layer 130 and oxygen barrier layer 134 and also prevent the oxidation of nWFM layer 130 during the processing of overlying layers (e.g., glue layer 136N or gate metal fill layer 138N). In some embodiments, adhesion layer 132 can include metal nitrides, such as TiN, TaN, and TiSiN. Similar to adhesion layer 132, oxygen barrier layer 134 can also prevent the oxidation of nWFM layer 130 during the processing of overlying layers. nWFM layer 130 is prevented from being oxidized because oxidized nWFM layers 130 (e.g., aluminum oxide-based layers) can have work function values closer to the valence band-edge energy (e.g., 5.2 eV of Si or 4.8 eV of SiGe) than the conduction band-edge energy (e.g., 4.1 eV of Si or 3.8 eV of SiGe) of Si-based or SiGe-based nanostructured channel regions 120N, and consequently increase the threshold voltage of NFET 102N1.

Oxygen barrier layer 134 can be selectively formed on adhesion layer 132 and can include Si, Ge, Ti, Al, Hf, Ta, Ni, Co, a combination thereof, or other suitable materials. In some embodiments, oxygen barrier layer 134 can include a bilayer (not shown) with a bottom layer disposed on adhesion layer 132 and a top layer disposed on the bottom layer. The bottom layer can include Si, Ge, Ti, Al, Hf, Ta, Ni, Co, a combination thereof, or other suitable materials, and the top layer can include an oxide of the material of the bottom layer, such as silicon oxide ($SiO_x$), germanium oxide ($GeO_x$), titanium oxide ($TiO_x$), aluminum oxide (AlOx), hafnium oxide ($HfO_x$), tantalum oxide ($TaO_x$), nickel oxide ($NiO_x$), cobalt oxide ($CoO_x$), a combination thereof, or other suitable materials. In some embodiments, adhesion layer 132 and oxygen barrier layer 134 can include a thickness ranging from about 1 nm to about 2 nm. Below the thickness range of 1 nm, adhesion layer 132 and/or oxygen barrier layer 134 may not adequately prevent the oxidation of nWFM layer 130. On the other hand, if the thicknesses are greater than 2 nm, the volume area for gate metal fill layer 138N decreases, and consequently increases the gate resistance of gate structure 112N.

Referring to FIGS. 1B-1E, glue layers 136N-136P can be formed substantially simultaneously with similar materials on oxygen barrier layer 130 and on HK gate dielectric layer 128 of PFET 102P1 with glue layer surfaces 136Na-136Pa substantially coplanar with surfaces 136Nb-136Pb of glue layer portions 136Ns-136Ps (visible in cross-sectional views of FIGS. 1D-1E; not visible in cross-sectional views of FIGS. 1B-1C) along sidewalls of gate structures 112N-112P. Top surfaces 136Na-136Nb of glue layer 136N are non-coplanar with top surfaces of HK gate dielectric layer 128, nWFM layer 130, adhesion layer 132, oxygen barrier layer 134, and gate metal fill layer 138N. Similarly, top surfaces 136Pa-136Pb of glue layer 136 are non-coplanar with top surface of HK gate dielectric layer 128.

Surfaces 136Nb-136Pb may not be extended above surfaces 136Na-136Pa to promote bottom-up deposition of gate metal fill layers 138N-138P within gate regions above surfaces 136Na-136Pa in gate portions 112N1-112P1. Glue layers 136N-136P can include a material for which gate metal fill layers 138N-138P have a deposition selectivity that is higher than the deposition selectivity for the materials of oxygen barrier layer 134 and HK gate dielectric layer 128 of PFET 102P1. As used herein, the term "deposition selectivity" refers to the ratio of the deposition rates on two different materials or surfaces under the same deposition conditions. The lower deposition selectivity for the materials of oxygen barrier layer 134 and HK gate dielectric layer 128 of PFET 102P1 inhibits conformal deposition of gate metal fill layers 138N-138P within gate regions above surfaces 136Na-136Pa in gate portions 112N1-112P1. The bottom-up deposition of gate metal fill layers 138N-138P can prevent the formation of voids and/or seams within gate regions above surfaces 136Na-136Pa.

In addition to providing a higher deposition selectivity for gate metal fill layers 138N-138P, glue layer 136P can function as a pWFM layer for PFET 102P1. To achieve an ultra-low threshold voltage for PFET 102P1 along with a higher deposition selectivity for gate metal fill layers 138N-138P, glue layers 136N-136P can include a metallic material with a work function value closer to a valence band-edge energy than a conduction band-edge energy of a material of nanostructured channel regions 122P. For example, glue layers 136N-136P can include a substantially Al-free (e.g., with no Al) metallic material with a work function value equal to or greater than 4.5 eV (e.g., about 4.5 eV to about 5.5 eV), which can be closer to the valence band-edge energy (e.g., 5.2 eV of Si or 4.8 eV of SiGe) than the conduction band-edge energy (e.g., 4.1 eV of Si or 3.8 eV of SiGe) of Si-based or SiGe-based nanostructured channel regions 122P. In some embodiments, glue layers 136N-136P can include substantially Al-free (e.g., with no Al) (i) Ti-based nitrides or alloys, such as TiN, TiSiN, titanium gold (Ti—Au) alloy, titanium copper (Ti—Cu) alloy, titanium chromium (Ti—Cr) alloy, titanium cobalt (Ti—Co) alloy, titanium molybdenum (Ti—Mo) alloy, or titanium nickel (Ti—Ni) alloy; (ii) Ta-based nitrides or alloys, such as TaN, TaSiN, Ta—Au alloy, Ta—Cu alloy, Ta—W alloy, tantalum platinum (Ta—Pt) alloy, Ta—Mo alloy, Ta—Ti alloy, or Ta—Ni alloy; (iv) metal nitrides, such as molybdenum nitride (MoN) and tungsten nitride (WN); (iii) a combination thereof; (iv) or other suitable Al-free metallic materials.

Thus, the use of glue layers 136N-136P as a pWFM layer and a bottom-up deposition promoting layer reduces the number of layers within gate structure 112P, and consequently increases the volume area for gate metal fill layer 138P within gate region above surface 136Pa. The volume area for gate metal fill layers 138N-138P are also increased by not having glue layer portions along sidewalls of gate structures 112N-112P within gate regions above surfaces 136Na-136Pa. In some embodiments, glue layers 136N-136P can include a thickness ranging from about 2 nm to about 4 nm. Below the thickness range of 2 nm, glue layers 136N-136P may not adequately function as a pWFM layer and a bottom-up deposition promoting layer. On the other hand, if the thickness is greater than 4 nm, the volume area for gate metal fill layer 138N-138P decreases, and consequently increases the gate resistance of gate structures 112N-112P.

In some embodiments, gate metal fill layers 138N-138P can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), and a combination thereof, or other suitable conductive materials. In some embodiments, gate metal fill layers 138N-138P can include a substantially fluorine-free metal layer (e.g., fluorine-free W). The substantially fluorine-free metal layer can include an amount of fluorine contaminants less than about 5 atomic percent in the form of ions, atoms, and/or molecules. In some embodiments, portions of gate metal fill layer 138N between nanostructured channel regions 120N and portions of gate metal fill layer 138P between nanostructured channel regions 122P can have seams 142, as shown in FIGS. 1D-1E (not shown in FIGS. 1B-1C for simplicity). In some embodiments, seams 142 can be formed due to conformal deposition of gate metal fill layers 138N-138P within gate regions below surfaces 136Na-136Pa in gate portions 112N2-112P2. The conformal deposition of gate metal fill layers 138N-138P within gate regions below surfaces 136Na-136Pa can be due to the presence of glue layer portions 136Ns-136Ps along sidewalls of gate structures 112N-112P, as shown in FIGS. 1D-1E.

In some embodiments, portions of gate metal fill layers 138N-138P above surfaces 136Na-136Pa can have respective heights H1-H2 ranging from about 15 nm to about 30 nm. Other suitable dimensions of heights H1-H2 are within the scope of the present disclosure. In some embodiments, height H2 can be greater than height H1 and a ratio between heights H2 and H1 (i.e., H2:H1) can range from about 1.1 to about 2. Portions of gate metal fill layer 138N above surface 136Na can have a width W1 along an X-axis and a width W3 along a Y-axis. Portions of gate metal fill layers 138P above surface 136Pa can have a width W2 along an X-axis and a width W4 along a Y-axis. In some embodiments, width W2 is greater than width W1 and width W4 is greater than width W3 due to the smaller number of layers underlying gate metal fill layer 138P in gate structure 112P compared to the number of layers underlying gate metal fill layer 138N in gate structure 112N.

Referring to FIGS. 1F-1I, in some embodiments, instead of gate metal fill layer 138N (FIGS. 1B and 1D), gate structure 112N can have dual gate metal fill layers 144N and 146N, which are separated from each other by a glue layer 137N. The discussion of gate metal fill layer 138N applies to gate metal fill layer 144N, unless mentioned otherwise. In some embodiments, gate metal fill layer 146N can include a material similar to or different from gate metal fill layer 144N. Gate metal fill layer 146N can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), and a combination thereof, or other suitable conductive materials. In some embodiments, gate metal fill layer 146N may not include fluorine-free W and the concentration of fluorine in gate metal fill layer 146N can be greater than that in gate metal fill layer 144N.

Similarly, in some embodiments, instead of gate metal fill layer 138P (FIGS. 1C and 1E), gate structure 112P can have dual gate metal fill layers 144P and 146P, which are separated from each other by a glue layer 137P. The discussion of gate metal fill layer 138P applies to gate metal fill layer 144P, unless mentioned otherwise. In some embodiments, gate metal fill layer 146P can include a material similar to or different from gate metal fill layer 144P. Gate metal fill layer 146P can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), and a combination thereof, or other suitable conductive materials. In some embodiments, gate metal fill layer 146P may not include fluorine-free W and the concentration of fluorine in gate metal fill layer 146P can be greater than that in gate metal fill layer 144P.

In some embodiments, gate metal fill layers 144N-144P are formed in a bottom-up deposition process (e.g., atomic layer deposition (ALD) process) with a deposition rate that is slower than the deposition rate of a conformal deposition process (e.g., chemical vapor deposition (CVD) process) used to form gate metal fill layers 146N-146P. The dual gate metal fill layers 144N-146N and 144P-146P are formed with different deposition rates to reduce manufacturing costs.

In some embodiments, gate metal fill layers 144N-146N can have heights H3-H4 with H3 being greater than H4 and gate region above surface 136N can have height H1. In some embodiments, a ratio between heights H3-H4 (i.e., H3:H4) can range from about 2 to about 3. In some embodiments, height H3 can be about 75% to about 90% of height H1 and height H4 can be about 10% to about 25% of height H1. In some embodiments, gate metal fill layers 144P-146P can have heights H5-H6 with H5 being equal to or greater than H6 and gate region above surface 136P can have height H2. In some embodiments, a ratio between heights H5-H6 (i.e., H5:H6) can range from about 1 to about 2. In some embodiments, height H5 can be about 50% to about 75% of height H2 and height H6 can be about 25% to about 50% of height H2. In some embodiments, heights H3-H4 are smaller than heights H5-H6, respectively. Within these ranges of relative dimensions of H1-H6, the gate resistances and manufacturing costs of gate structures 112N-112P can be reduced. On the other hand, outside these ranges of relative dimensions of H1-H6, the gate resistances and/or manufacturing costs of gate structures 112N-112P increases.

In some embodiments, glue layers 137N-137P can be formed substantially simultaneously with similar materials on gate metal fill layers 138N-138P, respectively. Glue layers 137N-137P can promote conformal deposition of gate metal fill layers 146N-146P. In some embodiments, glue layers 137N-137P can include a material similar to or different from glue layers 136N-136P. In some embodiments, glue layers 137N-137P can include substantially TiN, TiSiN, TaN, TaSiN, MoN, WN, a combination thereof, or other suitable conductive materials. In some embodiments, glue layers 137N-137P can include a thickness ranging from about 2 nm to about 4 nm. Below the thickness range of 2 nm, glue layers 137N-137P may not adequately function as a conformal deposition promoting layer. On the other hand, if the thickness is greater than 4 nm, the volume area for gate metal fill layer 146N-146P decreases, and consequently increases the gate resistance of gate structures 112N-112P.

Referring to FIGS. 1J-1K, in some embodiments, semiconductor device 100 can have NFET 102P1 with gate structure 112N similar to that discussed with reference FIGS. 1B and 1D and can have PFET 102P1 with gate structure 112P similar to that discussed with reference FIGS. 1G and 1I. In some embodiments, to reduce manufacturing costs dual gate metal fill layers 144P-146P are formed in PFET 102P1 and not in NFET 102N1. Since gate metal fill layer 146P is formed with a faster deposition rate, the volume area of gate region above surface 136Pa, which is greater than the volume area of gate region above surface 136Na can be filled faster. As a result, processing time and manufacturing costs for forming gate structure 112P can be reduced.

In some embodiments, gate structures 112N-112P described with reference to FIGS. 1B-1E can be formed for gate structures 112N-112P with gate lengths GL less than 36 nm. In some embodiments, gate structures 112N-112P described with reference to FIGS. 1F-1I can be formed for gate structures 112N-112P with gate lengths GL greater than 36 nm (e.g., gate lengths GL between about 37 nm and 150 nm).

Referring to FIGS. 1L-1O, in some embodiments, instead of the structures of glue layers 136N-136P shown in FIGS. 1B-1E, glue layers 136N-136P can have the structures shown in FIGS. 1L-1O. In some embodiments, glue layers 136N-136P can have extended portions 136Nx-136Px, which extends above surfaces 136Na-136Pa by distances D1-D2, respectively. Extended portions 136Nx-136Px can be formed as a result of partial etching during an etching process of glue layers 136N-136P, which is described in further detail below. In some embodiments, distance D1 can be equal to or greater than distance D2. In some embodiments, distance D1 can be about 20% to about 30% of height H1 and distance D2 can be about 15% to about 25% of height H2. In some embodiments, extended portions 136Nx-136Px can form angles A-B with respective surfaces 136Na-136Nb and angle A can be greater than angle B as a result of the etching process used in the formation of glue layers 136N-136P.

Figures 1P, 1Q:
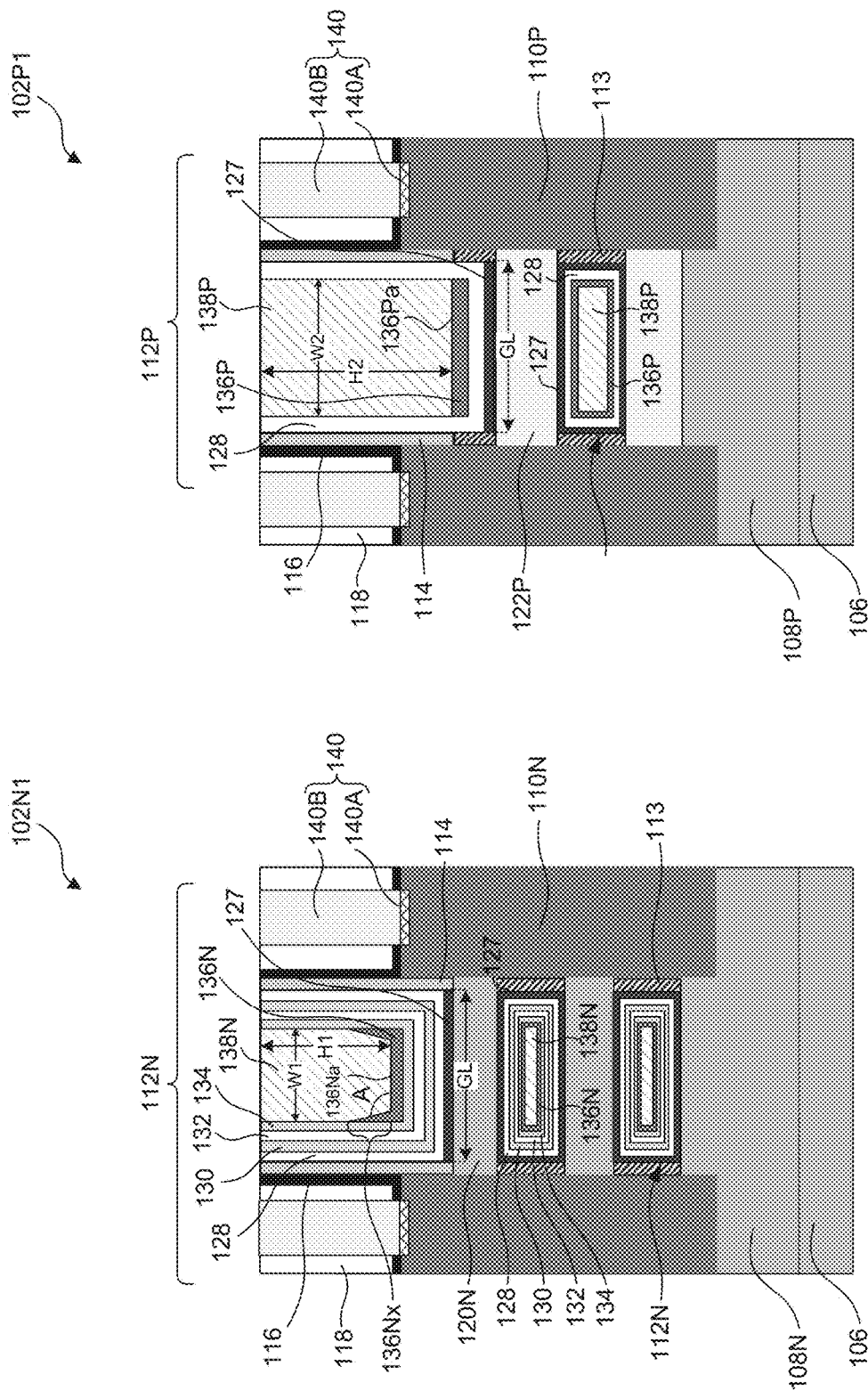
Figures 1R, 1S:
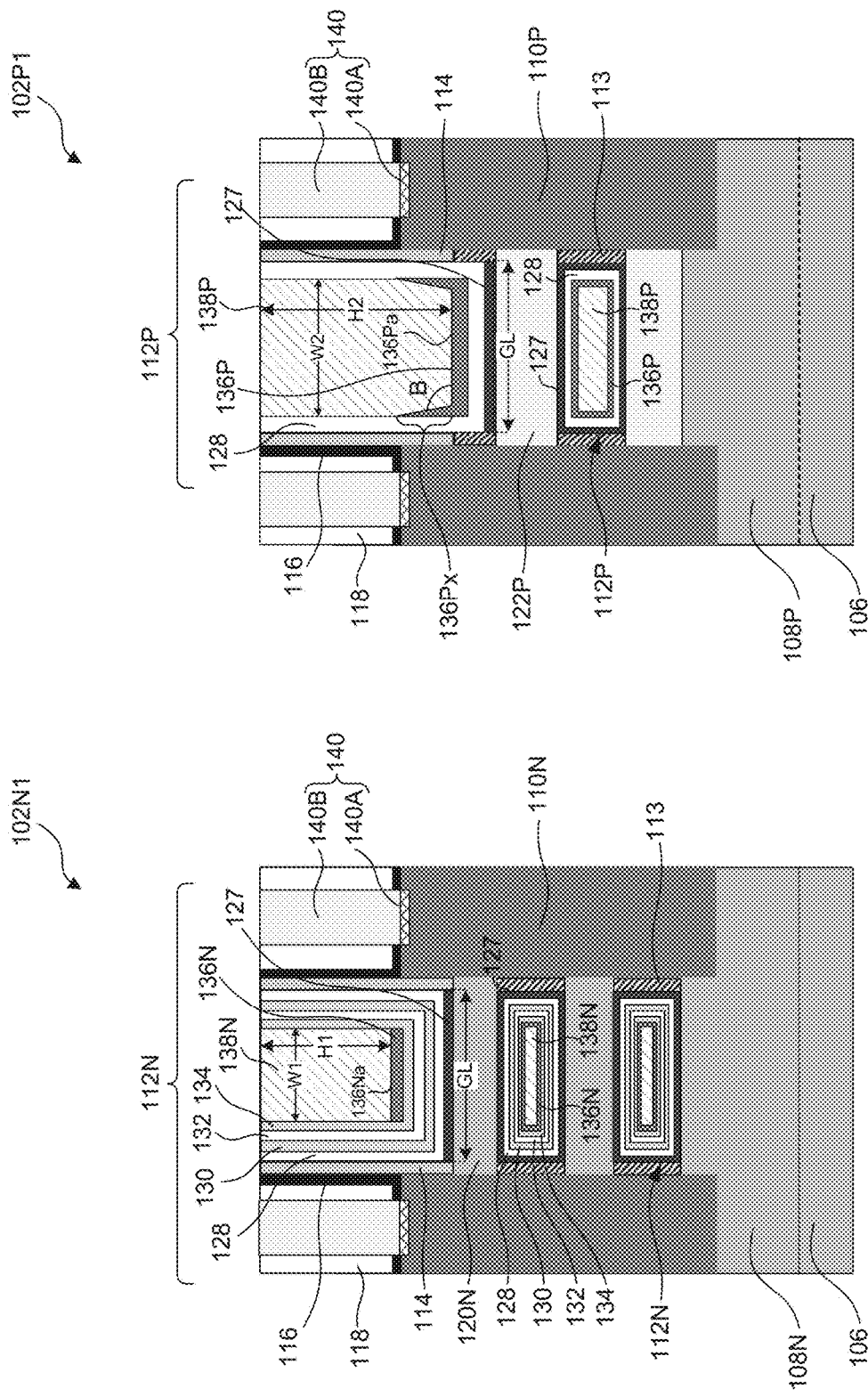

Referring to FIGS. 1P-1Q, in some embodiments, glue layer 136N can be formed with extended portions 136Nx and glue layer 136P can be formed without extended portion 136Px. The difference in the structures of glue layers 136N-136P can be due to the challenges of removing extended portion 136Nx compared to removing extended portion 136Px because the volume area above surface 136Na is smaller than the volume area above surface 136Pa.

Referring to FIGS. 1R-1S, in some embodiments, glue layer 136N can be formed without extended portions 136Nx and glue layer 136P can be formed with extended portion 136Px. Such structures of glue layers 136N-136P can be formed when glue layers 136N-136P are not formed at the same time.

Figure 2:
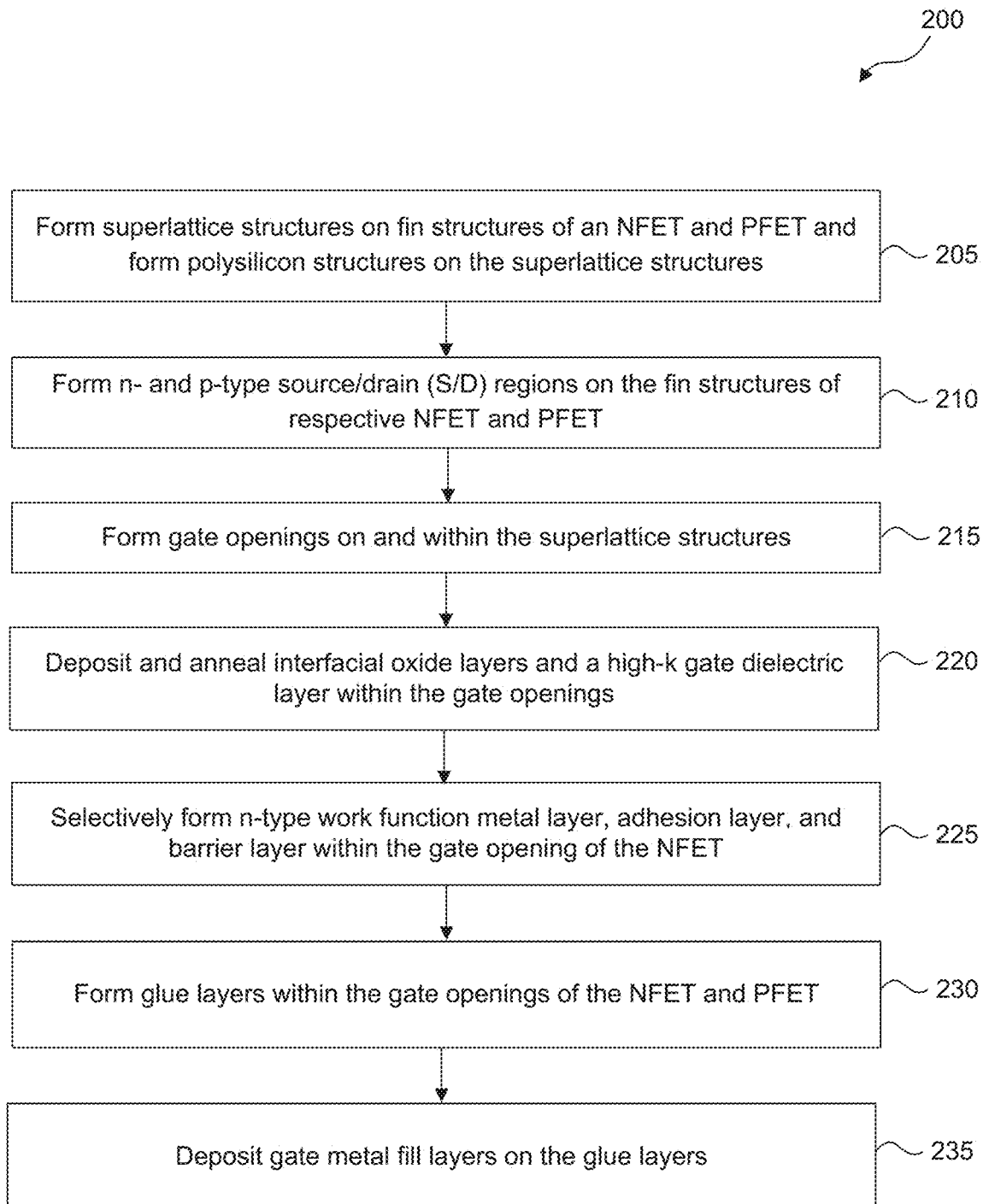
FIG. 2 is a flow diagram of a method for fabricating a semiconductor device with different gate structure configurations, in accordance with some embodiments.

FIG. 2 is a flow diagram of an example method 200 for fabricating NFET 102N1 and PFET 102P1 of semiconductor device 100, according to some embodiments. For illustrative purposes, the operations illustrated in FIG. 2 will be described with reference to the example fabrication process for fabricating NFET 102N1 and PFET 102P1 as illustrated in FIGS. 3A-26B. FIGS. 3A-26B are cross-sectional views of NFET 102N1 and PFET 102P1 along lines A-A and B-B of semiconductor device 100 at various stages of fabrication, according to various embodiments. Operations can be performed in a different order or not performed depending on specific applications. It should be noted that method 200 may not produce a complete NFET 102N1 and PFET 102P1. Accordingly, it is understood that additional processes can be provided before, during, and after method 200, and that some other processes may only be briefly described herein. Elements in FIGS. 3A-26B with the same annotations as elements in FIGS. 1A-1S are described above.

Figures 3A, 3B:
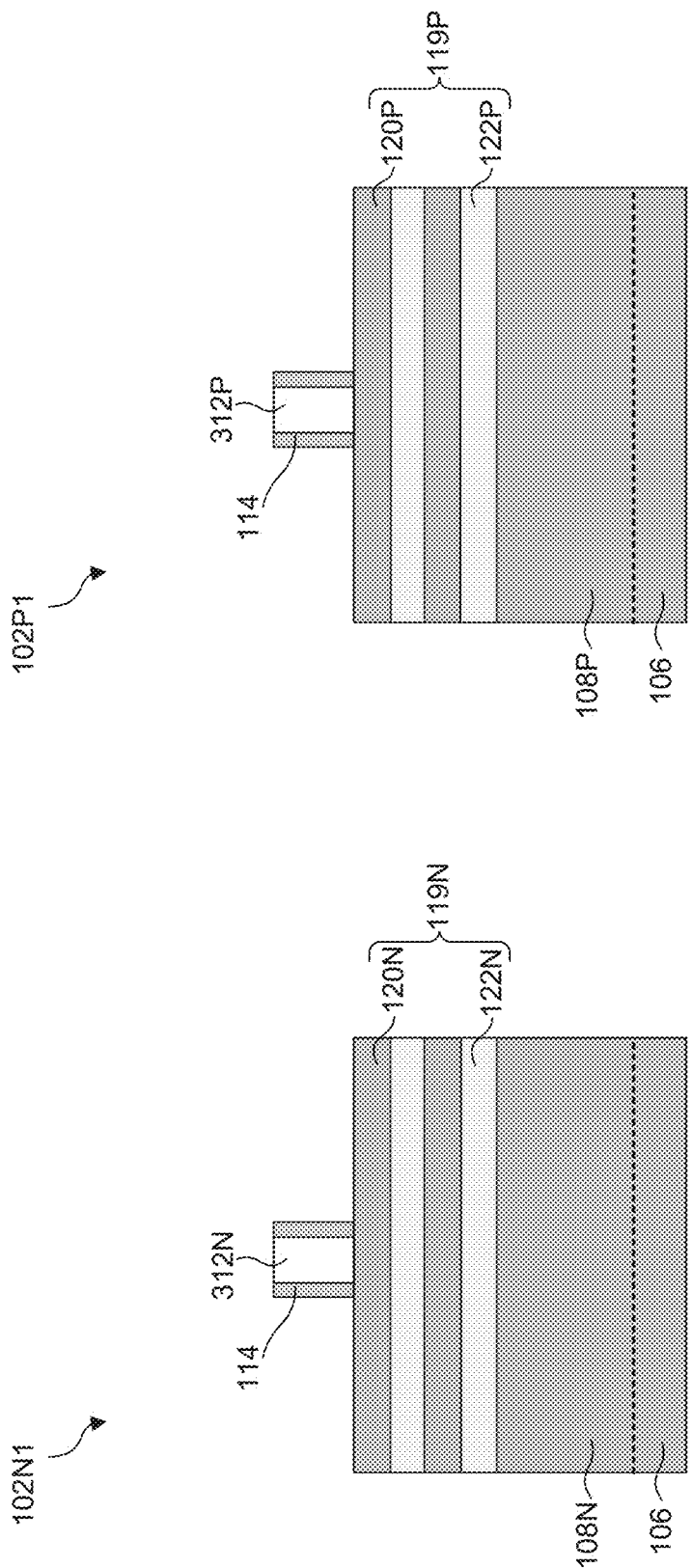

In operation 205, superlattice structures are formed on fin structures of an NFET and PFET, and polysilicon structures are formed on the superlattice structures. For example, as shown in FIGS. 3A-3B, polysilicon structures 312N-312P are formed on respective superlattice structures 119N-119P, which are epitaxially formed on respective fin structures 108N-108P. Superlattice structure 119N can include nanostructured layers 120N-122N arranged in an alternating configuration. Similarly, superlattice structure 119P can include nanostructured layers 120P-122P arranged in an alternating configuration. In some embodiments, nanostructured layers 120N-120P include materials similar to each other and nanostructured layers 122N-122P include materials similar to each other. In some embodiments, nanostructured layers 120N-120P can include Si without any substantial amount of Ge (e.g., with no Ge) and nanostructured layers 122N-122P can include SiGe. During subsequent processing, polysilicon structures 312 and nanostructured layers 120P and 122N can be replaced in a gate replacement process to form gate structures 112N-112P.

Figure 4B:
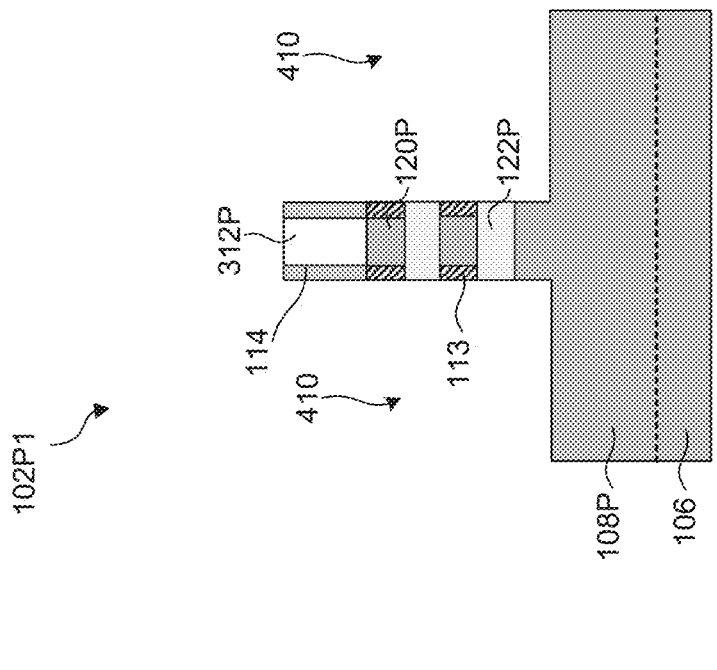
Figure 4A:
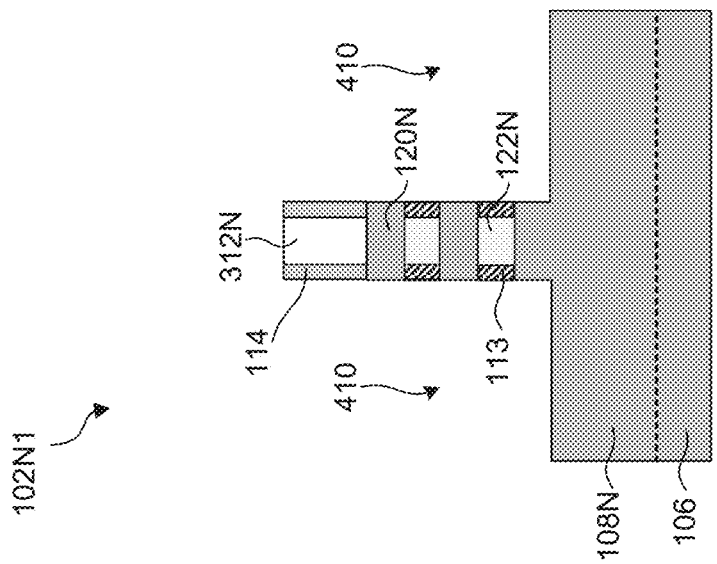
Figure 5B:
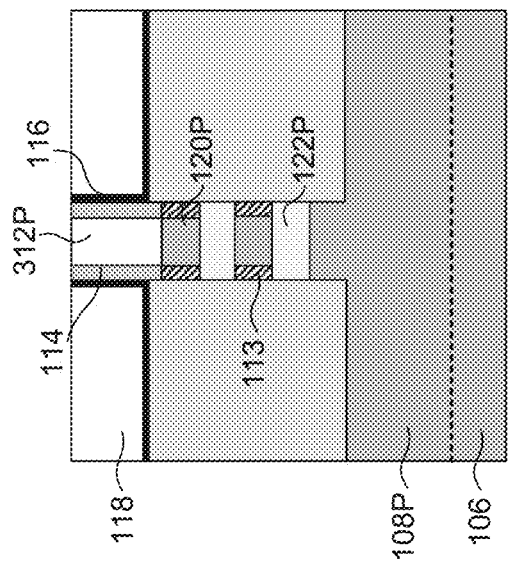
Figure 5A:
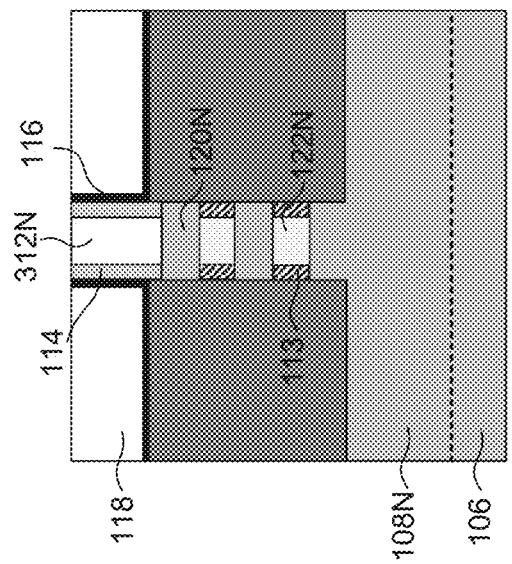

Referring to FIG. 2, in operation 210, n- and p-type S/D regions are formed on the fin structures of respective NFET and PFET. For example, as described with reference to FIGS. 4A-5B, n- and p-type S/D regions 110N-110P are formed on respective fin structures 108N and 108P. The selective formation of n- and p-type S/D regions 110N-110P can include sequential operations of (i) forming S/D openings 410, through superlattice structures 119N-119P, on portions of fin structures 108N-108P that are not underlying polysilicon structures 312, as shown in FIGS. 4A-4B, and (ii) epitaxially growing n-type and p-type semiconductor materials within S/D openings 410, as shown in FIGS. 5A-5B. In some embodiments, inner spacers 113 can be formed between operations (i) and (ii) of the formation process of epitaxial S/D regions 110N-110P, as shown in FIGS. 5A-5B. Inner spacers 113 can be formed after the formation of S/D openings 410, as shown in FIGS. 5A-5B. After the formation of S/D regions 110N-110P, ESL 116 and ILD layer 118 can be formed on S/D regions 110N-110P to form the structures of FIGS. 5A-5B.

Figure 6B:
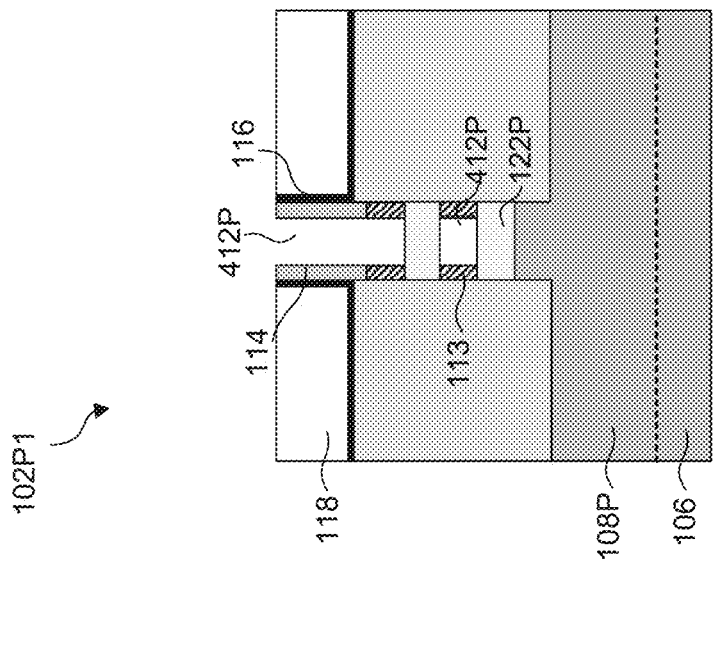
Figure 6A:
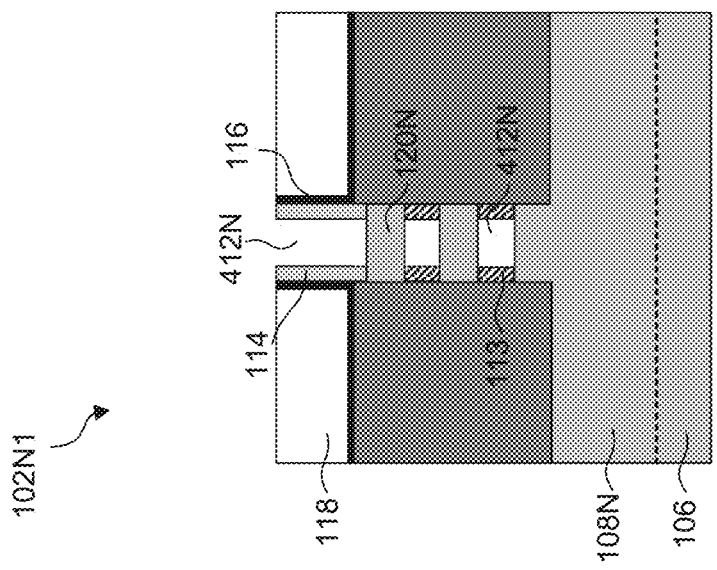

Referring to FIG. 2, in operation 215, gate openings are formed on and within the superlattice structures. For example, as shown in FIGS. 6A-6B, gate openings 412N-412P can be formed on and within superlattice structures 119N-119P. The formation of gate openings 412N can include sequential operations of (i) forming a masking layer (not shown) on the structure of FIG. 5B, (ii) etching polysilicon structure 312N from the structure of FIG. 5A, (iii) etching nanostructured layers 122N from the structure of FIG. 5A, and (iv) removing the masking layer from the structure of FIG. 5B. The formation of gate openings 412P can include sequential operations of (i) forming a masking layer (not shown) on the structure of FIG. 6A, (ii) etching polysilicon structure 312P from the structure of FIG. 5B, (iii) etching nanostructured layers 120P from the structure of FIG. 5B, and (iv) removing the masking layer from the structure of FIG. 6A.

Referring to FIG. 2, in operations 220-235, gate-all-around (GAA) structures are formed in the gate openings. For example, based on operations 220-235, gate structures 112N-112P can be formed surrounding nanostructured channel regions 120N-122P, as described with reference to FIGS. 7A-26B.

Referring to FIG. 2, in operation 220, interfacial oxide layers and an HK gate dielectric layer are deposited and annealed within the gate openings. For example, as described with reference to FIGS. 7A-9B, IO layers 127 and HK gate dielectric layer 128 can be deposited and annealed within gate openings 412N-412P of FIGS. 6A-6B. IO layers 127 can be formed on exposed surfaces of nanostructured channel regions 120N-122P within respective gate openings 412N-412P. In some embodiments, IO layers 127 can be formed by exposing nanostructured channel regions 120N-122P to an oxidizing ambient. The oxidizing ambient can include a combination of ozone ($O_3$), a mixture of ammonia hydroxide, hydrogen peroxide, and water ("SC1 solution"), and/or a mixture of hydrochloric acid, hydrogen peroxide, water ("SC2 solution").

Figure 7B:
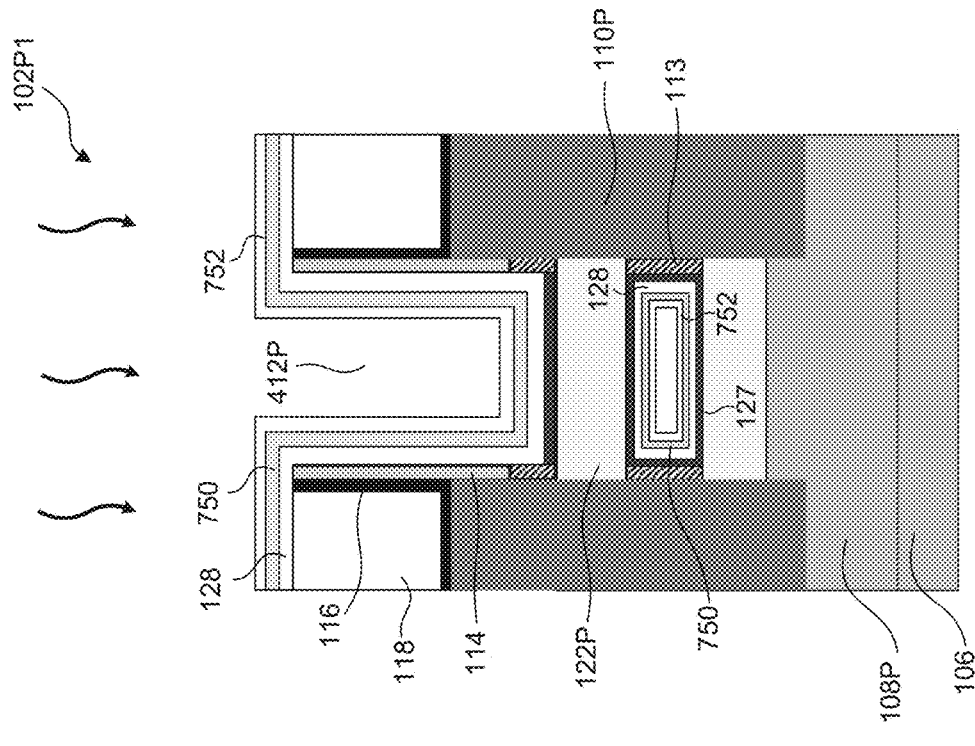
Figure 7A:
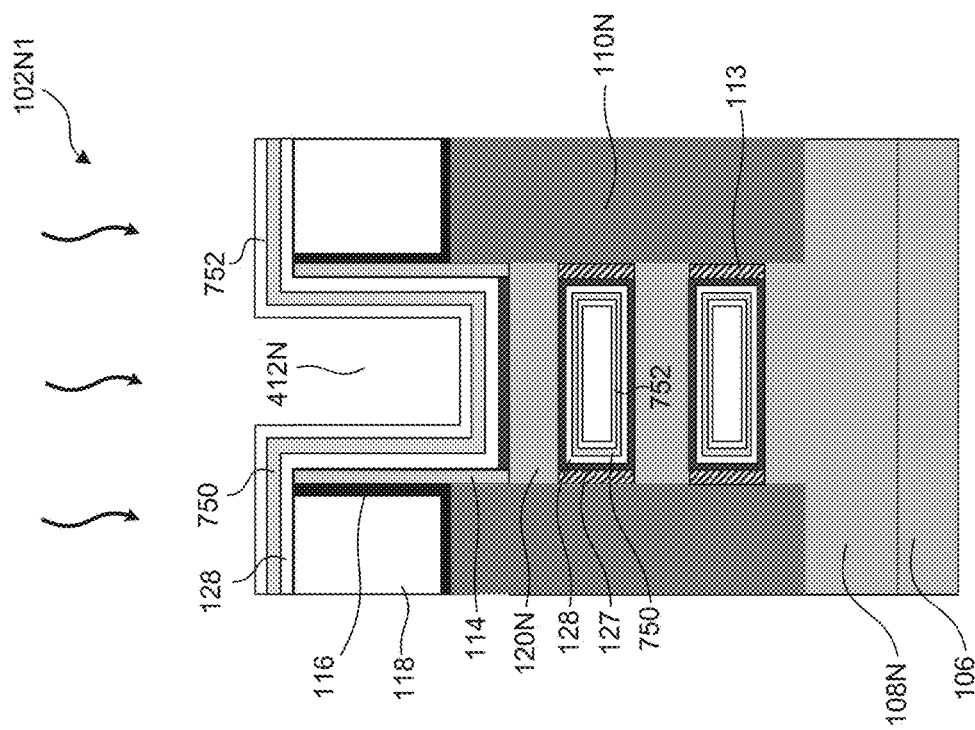

The deposition of HK gate dielectric layer 128 can include depositing a HK gate dielectric material within gate openings 412N-412P after the formation of IO layers 127, as shown in FIGS. 7A-7B. In some embodiments, HK gate dielectric layer 128 can be formed with an ALD process using hafnium chloride ($HfCl_4$) as a precursor at a temperature ranging from about 250° C. to about 350° C. Other temperature ranges are within the scope of the disclosure.

The formation of HK gate dielectric layer 128 can be followed by a three-stage annealing process to improve the electrical characteristics and/or reliability of IO layers 127 and/or HK gate dielectric layer 128. The first-stage annealing process can include sequential operations of (i) depositing a nitride capping layer 750 on HK dielectric layer 128, as shown in FIGS. 7A-7B, (ii) in-situ depositing a Si capping layer 752 on nitride capping layer 750, as shown in FIGS. 7A-7B, and (iii) performing a first spike annealing process on the structures of FIGS. 7A-7B.

In some embodiments, an interface layer (not shown) having hafnium silicon oxide ($HfSiO_x$) can be formed at the interface between IO layers 127 and HK gate dielectric layer 128 after the first spike annealing process. In some embodiments, nitride capping layer 750 can include TiSiN or TiN and can be deposited by an ALD or a CVD process using titanium tetrachloride ($TiCl_4$), silane ($SiH_4$), and/or ammonia ($NH_3$) as precursors at a temperature ranging from about 400° C. to about 500° C. Other temperature ranges are within the scope of the disclosure. Nitride capping layer 750 can have a thickness ranging from about 1 nm to about 3 nm or other suitable dimensions and can react with HK gate dielectric layer 128 during subsequent first and/or second spike annealing processes (described below) to form a barrier layer (not shown) on HK gate dielectric layer 128. In some embodiments, the barrier layer can include hafnium titanium silicate ($HfTiSiO_x$) or hafnium titanium oxide ($HfTiO_x$) with a thickness ranging from about 1 nm to about 3 nm or other suitable dimensions. The barrier layer can prevent diffusion of elements (e.g., metals and oxygen) into IO layers 127 and/or HK gate dielectric layer 128 from overlying layers during subsequent processing. In some embodiments, the barrier layer can also function as an etch stop layer during the removal of nitride capping layer 750 after the second-stage annealing process.

The in-situ deposition of Si capping layer 752 can include an ALD, a CVD, or a PVD process. In some embodiments, the in-situ deposition of Si capping layer 752 can include a soaking process with $TiCl_4$ and $SiH_4$ gases at a temperature ranging from about 400° C. to about 500° C. Other temperature ranges are within the scope of the disclosure. The soaking process can include flowing $TiCl_4$ gas for a time period ranging from about 80 seconds to about 100 seconds and then flowing $SiH_4$ gas for a time period ranging from about 100 seconds to about 200 seconds on the surface of nitride capping layer 750. In some embodiments, Si capping layer 752 can include Si or its compound and/or can include amorphous or polycrystalline Si. Si capping layer 752 can prevent oxidation of IO layers 127 and/or HK gate dielectric layer 128 and as a result, prevent additional growth of IO layers 127 and/or HK gate dielectric layer 128 during subsequent annealing processes and/or ex-situ processes.

The first spike annealing process can include performing an annealing process in a nitrogen ambient at an annealing temperature ranging from about 800° C. to about 900° C. for a time period ranging from about 1 second to about 5 seconds. Other temperature and time period ranges are within the scope of the disclosure. According to some embodiments, the first spike annealing process can strengthen the chemical bonds at the interface between IO layers 127 and HK gate dielectric layer 128 to improve the reliability of IO layers 127 and/or HK gate dielectric layer 128, and consequently, improve the reliability of gate structures 112N-112P.

Figure 8B:
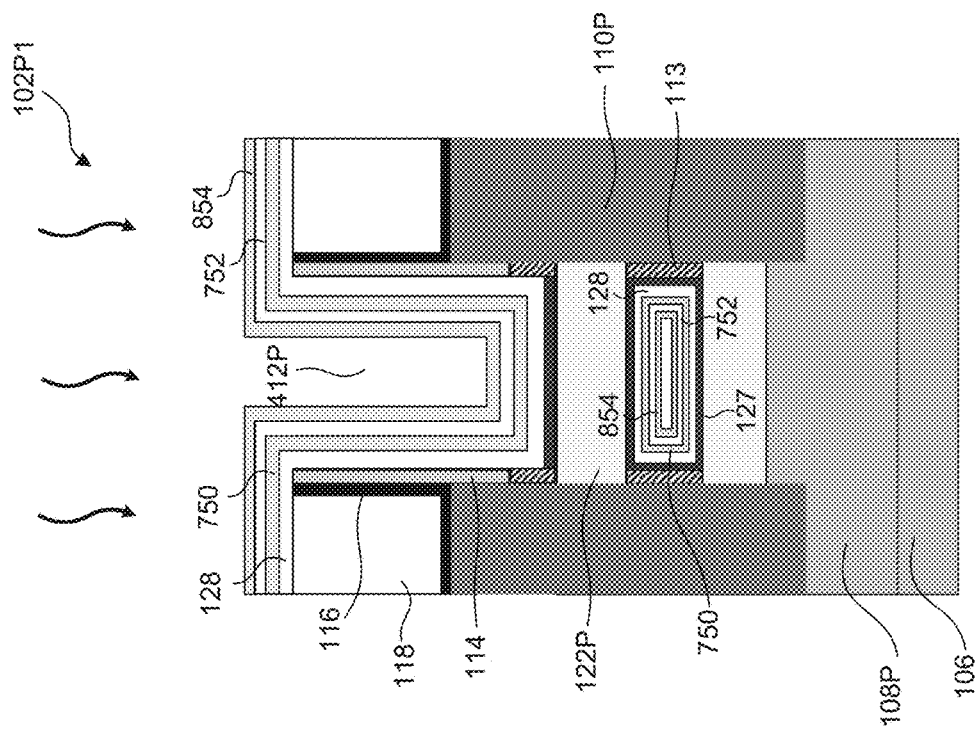
Figure 8A:
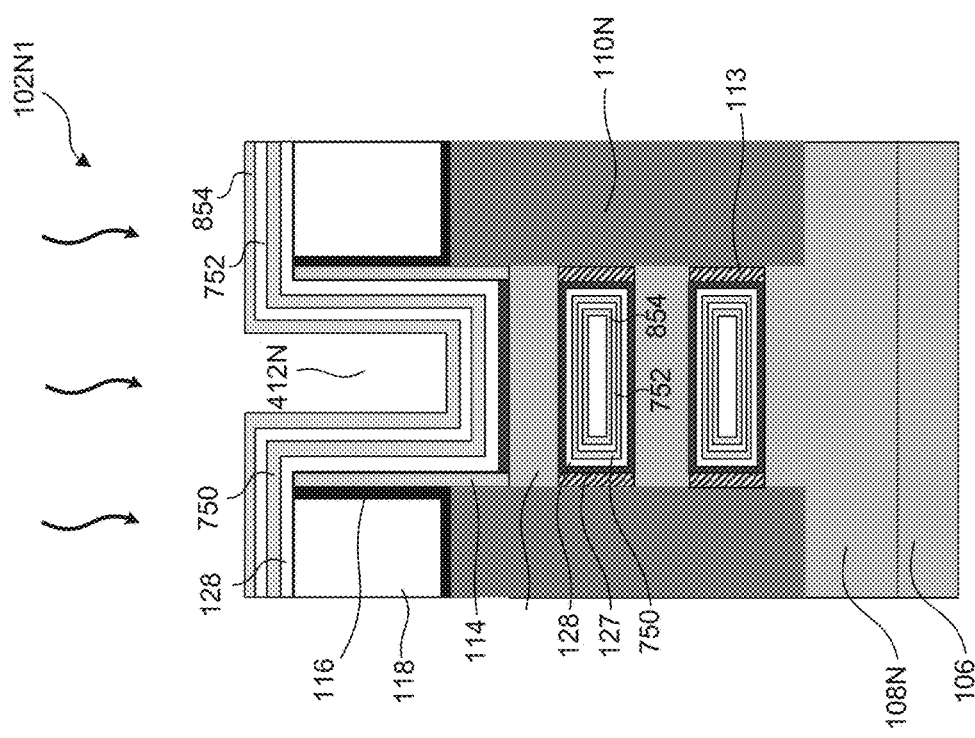

The second-stage annealing process can include sequential operations of (i) ex-situ depositing a Si capping layer 854 on the structures of FIGS. 7A-7B, as shown in FIGS. 8A-8B, after the first spike annealing process and (ii) performing a second spike annealing process on the structures of FIGS. 8A-8B. The ex-situ deposition of Si capping layer 854 can include an ALD, a CVD, or a PVD process. In some embodiments, the ex-situ deposition of Si capping layer 854 can include depositing a silicon-based layer on Si capping layer 752 by a CVD process using $SiH_4$, disaline ($Si_2H_6$), and hydrogen at a temperature ranging from about 350° C. to about 450° C. Other temperature ranges are within the scope of the disclosure. Si capping layer 854 can be deposited with a thickness (e.g., about 2 nm to about 5 nm) about 2 to about 5 times greater than the thickness of Si capping layer 752. The thicker Si capping layer 854 can prevent oxidation of IO layers 127 and/or HK gate dielectric layer 128 during the subsequent second spike annealing process, which is performed at a temperature higher than that of the first spike annealing process. The second spike annealing process can be performed in a nitrogen ambient at an annealing temperature ranging from about 900° C. to about 950° C. for a time period ranging from about 1 second to about 10 seconds. Other temperature and time period ranges are within the scope of the disclosure.

Figure 9B:
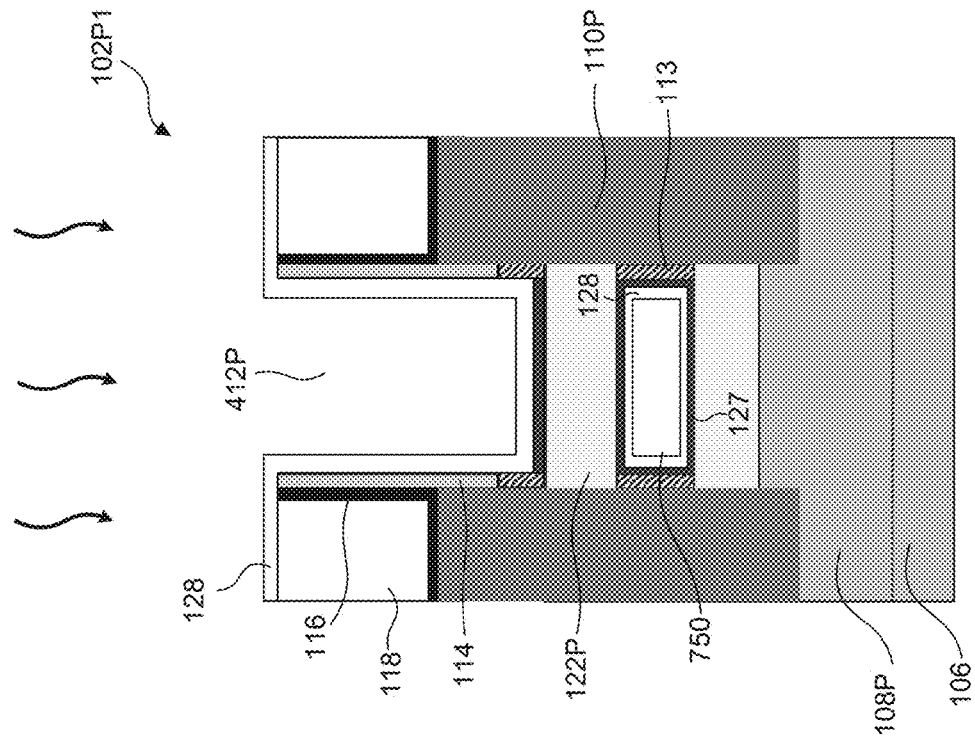
Figure 9A:
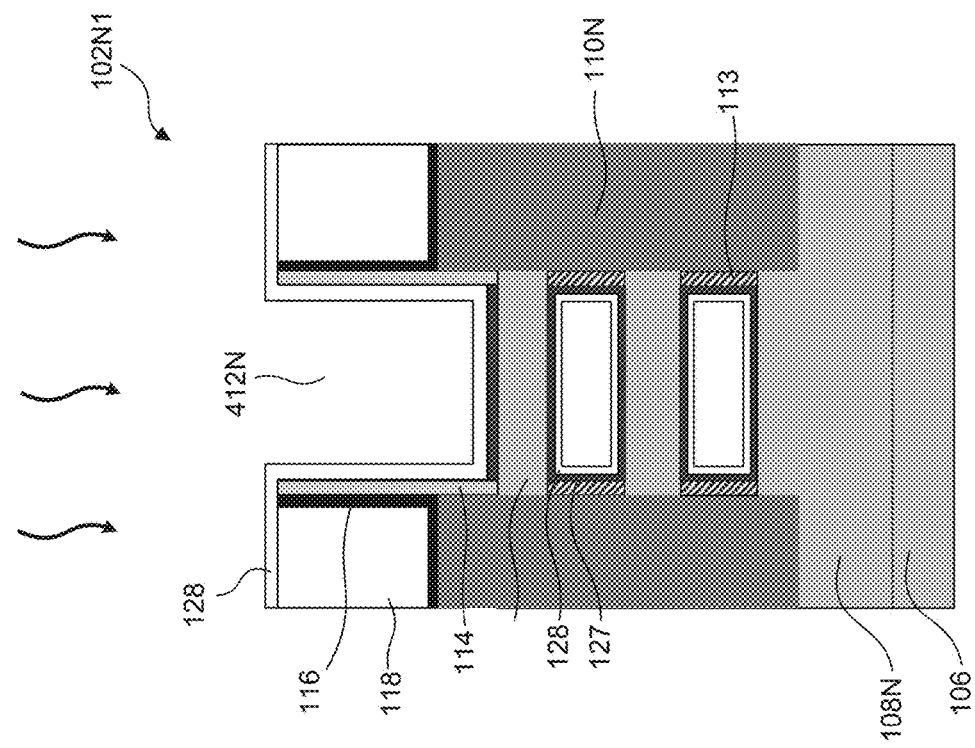

The third-stage annealing process can include sequential operations of (i) removing nitride layer 750, in-situ Si capping layer 752, and ex-situ Si capping layer 854, as shown in FIGS. 9A-9B, after the second spike annealing process, and (ii) performing a third spike annealing process on the structures of FIGS. 9A-9B. Nitride layer 750, in-situ Si capping layer 752, and ex-situ Si capping layer 854 can be removed by a wet etching process using hydrogen peroxide solution. The third spike annealing process can be performed in an $NH_3$ ambient at an annealing temperature ranging from about 850° C. to about 950° C. Other temperature ranges are within the scope of the disclosure. The third spike annealing process can incorporate nitrogen into HK gate dielectric layer 128 to remove defects, such as oxygen vacancies from HK gate dielectric layer 128 and as a result, improve the reliability of gate structures 112N-112P. In some embodiments, the annealing temperatures of the first and third spike annealing processes can be similar to or different from each other. In some embodiments, the annealing temperature of the second spike annealing process can be higher than the annealing temperatures of the first and third spike annealing processes.

Figure 10B:
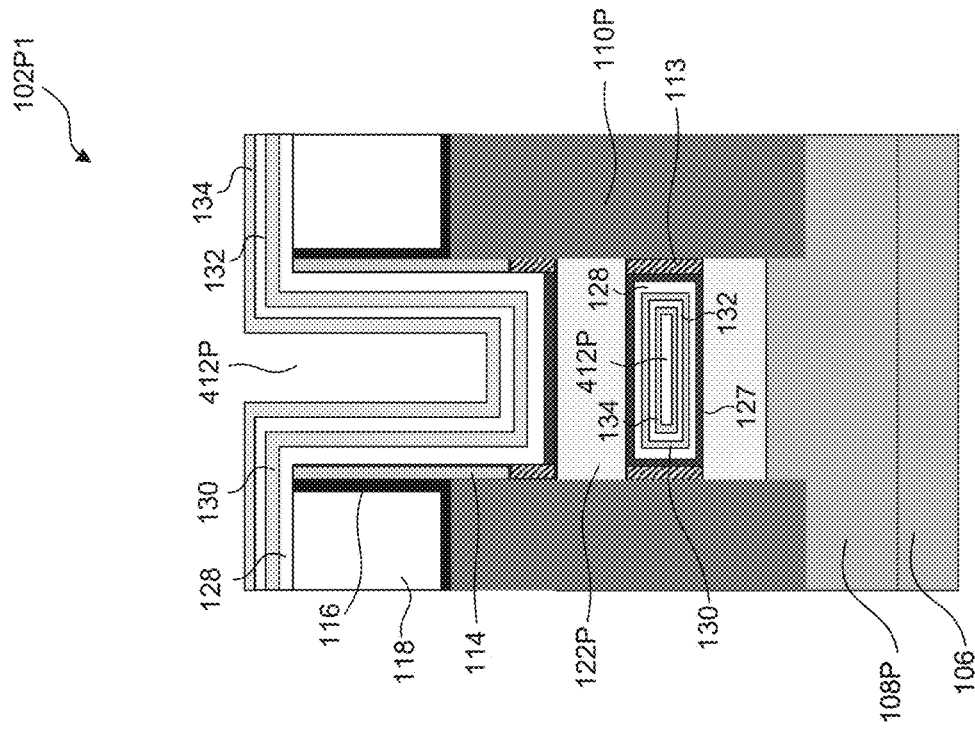
Figure 10A:
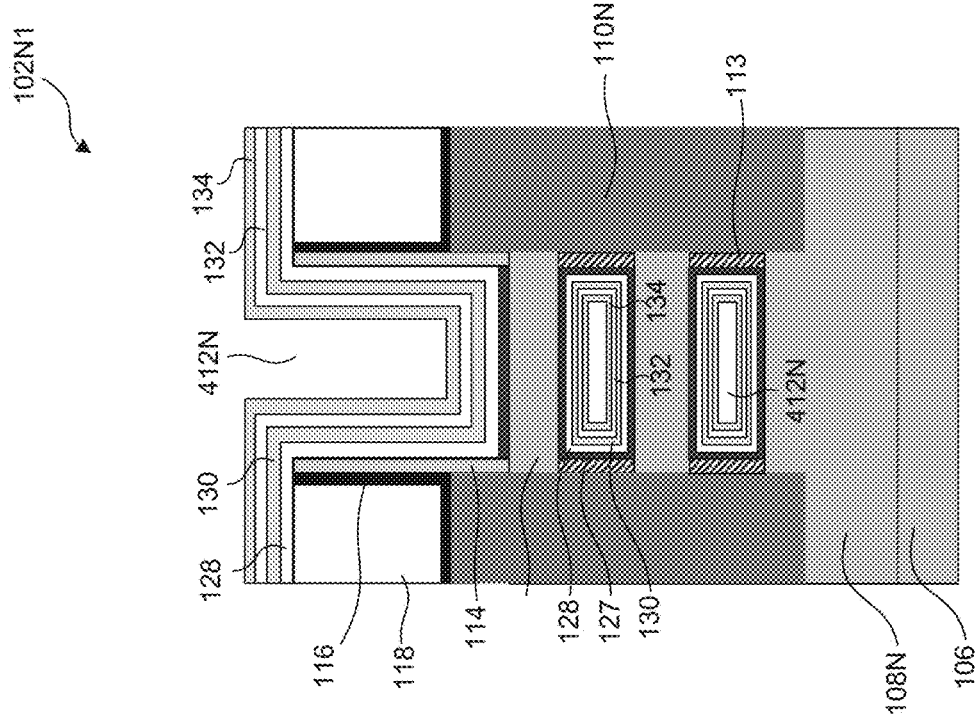

Referring to FIG. 2, in operation 225, nWFM layer, adhesion layer, and barrier layer are formed within the gate opening of the NFET. For example, as described with reference to FIGS. 10A-11B, nWFM layer 130, adhesion layer 132, and oxygen barrier layer 134 are selectively formed within gate opening 412N. The selective formation of nWFM layer 130, adhesion layer 132, and oxygen barrier layer 134 can include sequential operations of (i) depositing nWFM layer 130 within gate openings 412N-412P after the third spike annealing process, as shown in FIGS. 10A-10B, (ii) depositing adhesion layer 132 on nWFM layer 130, as shown in FIGS. 10A-10B, (iii) depositing oxygen barrier layer 134 on adhesion layer 132, as shown in FIGS. 10A-10B, (iv) forming a masking layer (not shown) on the structure of FIG. 10A, (v) removing portions of deposited nWFM layer 130, adhesion layer 132, and oxygen barrier layer 134 from gate opening 412P, as shown in FIG. 11B, and (vi) removing the masking layer from the structure of FIG. 11A.

The deposition of nWFM layer 130 can include depositing about 1 nm to about 3 nm thick Al-based nWFM layer on HK gate dielectric layer 128 with an ALD or a CVD process using titanium tetrachloride ($TiCl_4$) and titanium ethylene aluminum (TEAl) or tantalum chloride (TaCl$_5$) and trimethylaluminium (TMA) as precursors at a temperature ranging from about 350° C. to about 450° C. Other temperature ranges are within the scope of the disclosure. In some embodiments, the Al-based nWFM layer can be deposited in an ALD process of about 4 cycles to about 12 cycles, where one cycle can include sequential periods of: (i) first precursor gas (e.g., TiCl$_4$ or TaCl$_5$) flow, (ii) a first gas purging process, (iii) a second precursor gas (e.g., TEAl or TMA) gas flow, and (iv) a second gas purging process.

The deposition of adhesion layer 132 can include depositing about 1 nm to about 2 nm thick metal nitride layer with an ALD or a CVD process using TiCl$_4$ and NH$_3$ as precursors at a temperature ranging from about 350° C. to about 450° C. Other temperature ranges are within the scope of the disclosure. In some embodiments, adhesion layer 132 can be deposited in an ALD process of about 30 cycles to about 90 cycles, where one cycle can include sequential periods of: (i) first precursor gas (e.g., TiCl$_4$) flow, (ii) a first gas purging process, (iii) a second precursor gas (e.g., NH$_3$) gas flow, and (iv) a second gas purging process.

The deposition of oxygen barrier layer 134 can include depositing about 1 nm to about 2 nm thick oxygen barrier layer 134 with a soaking process in an ALD or a CVD chamber using TiCl$_4$ and SiH$_4$ gases at a temperature ranging from about 400° C. to about 450° C. and pressure ranging from about 3 torr to about 30 torr. Other temperature and pressure ranges are within the scope of the disclosure. The soaking process can include flowing TiCl$_4$ gas for a time period ranging from about 80 seconds to about 100 seconds and then flowing SiH$_4$ gas for a time period ranging from about 100 seconds to about 200 seconds on the surface of adhesion layer 132.

Figures 13A, 13B:
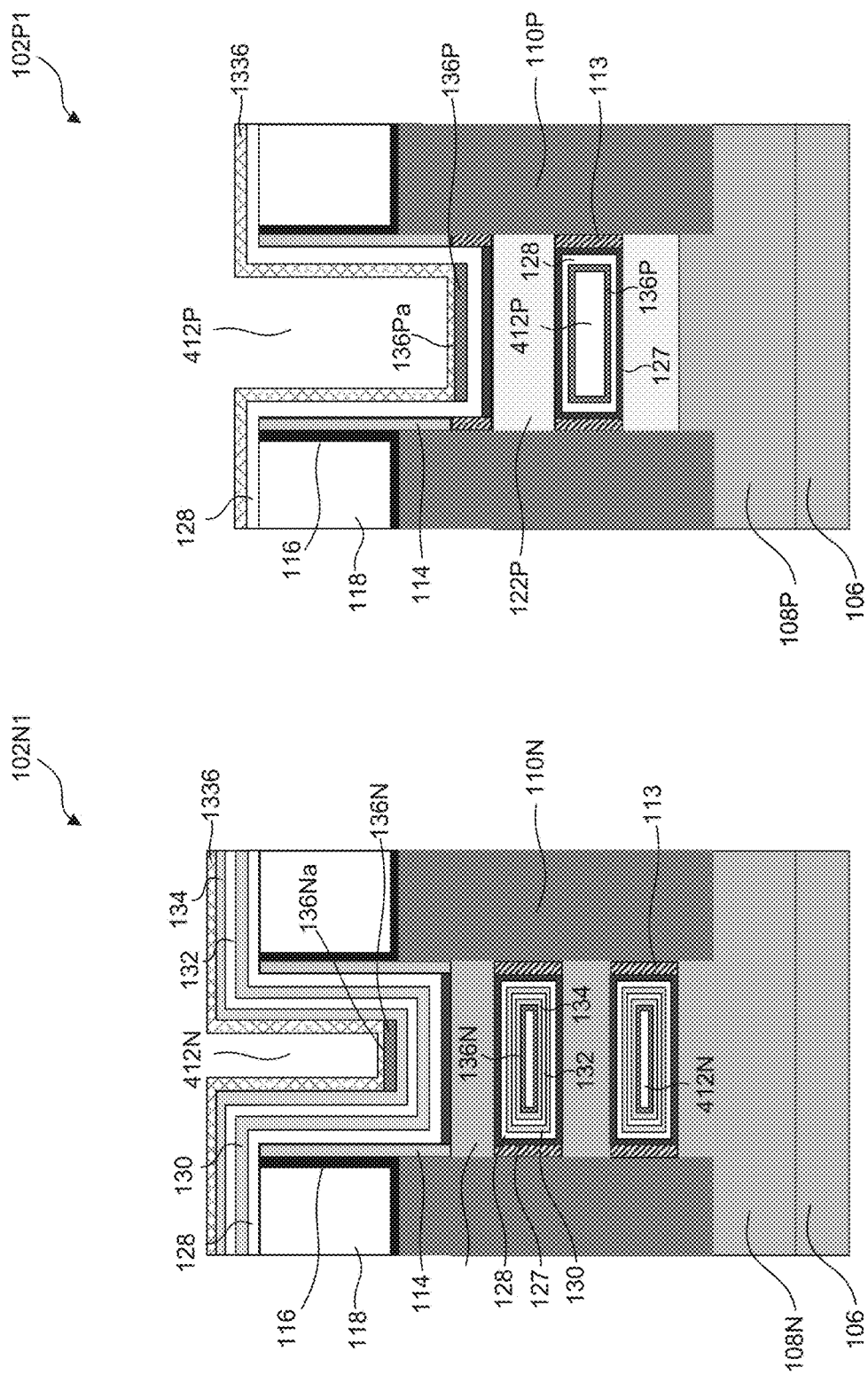
Figures 14A, 14B:
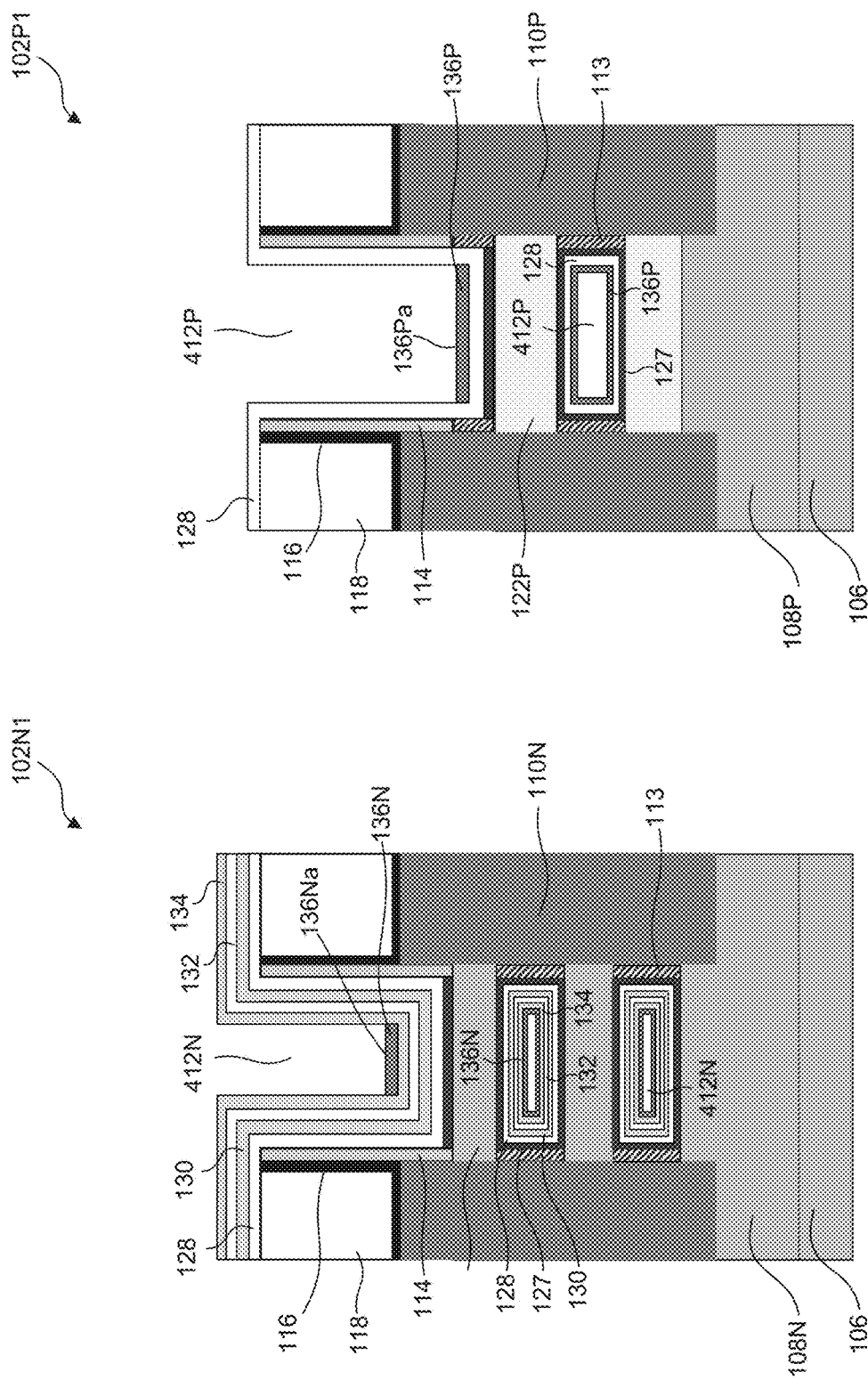
Figures 15A, 15B:
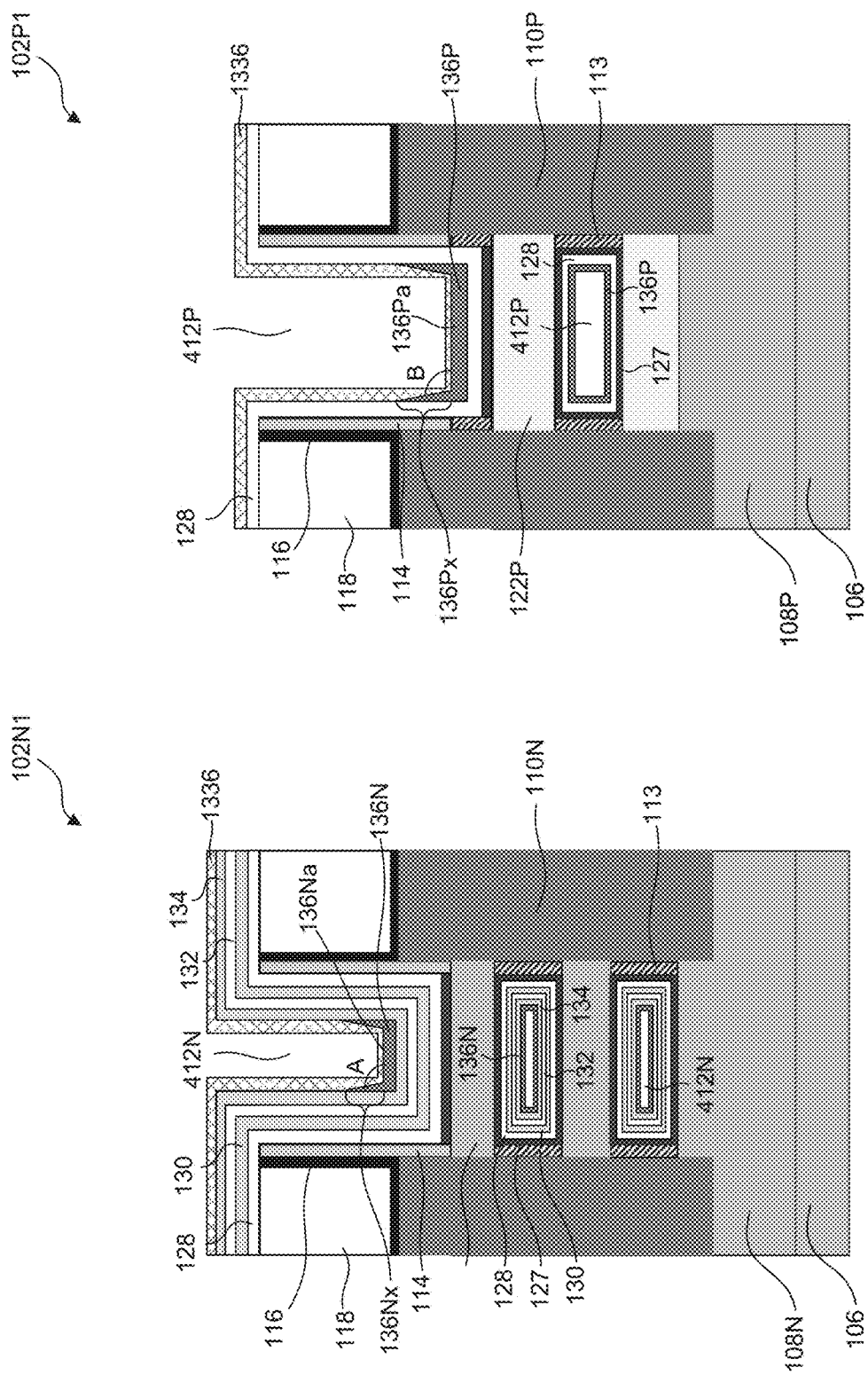

Referring to FIG. 2, in operation 230, glue layers are formed within the gate openings of the NFET and PFET. For example, as described with reference to FIGS. 12A-16B, glue layers 136N-136P are formed within gate openings 412N-412P. The formation of glue layers 136N-136P can include sequential operations of (i) depositing an Al-free (e.g., with no Al) metallic layer 1236 within gate openings 412N-412P, as shown in FIGS. 12A-12B, (ii) performing an oxygen plasma treatment on the structures of FIGS. 12A-12B to oxidize portions of Al-free metallic layer 1236 to form metal oxide layer 1336, as shown in FIGS. 13A-13B, and (iii) removing metal oxide layer 1336 from the structures of FIGS. 13A-13B to form the structures of FIGS. 14A-14B. The structures of glue layers 136N-136P formed in FIGS. 14A-14B are described above with reference to FIGS. 1B-1E.

The deposition of Al-free metallic layer 1236 can include depositing about 2 nm to about 4 nm thick Al-free metallic layer with an ALD or a CVD process using TiCl$_4$ or WCl$_5$ and NH$_3$ as precursors at a temperature ranging from about 400° C. to about 450° C. Other temperature ranges are within the scope of the disclosure. In some embodiments, Al-free metallic layer 1236 can be deposited in an ALD process of about 40 cycles to about 100 cycles, where one cycle can include sequential periods of: (i) first precursor gas (e.g., TiCl$_4$ or WCl$_5$) flow, (ii) a first gas purging process, (iii) a second precursor gas (e.g., NH$_3$) gas flow, and (iv) a second gas purging process.

The oxygen plasma treatment can include exposing the structures of FIGS. 12A-12B to oxygen plasma 1256 at a temperature ranging from about 160° C. to about 250° C. in a processing chamber. Other temperature ranges are within the scope of the disclosure. Oxygen plasma 1256 can be generated in the processing chamber from oxygen gas supplied at a flow rate ranging from about 2000 standard cubic centimeter (sccm) to about 6000 sccm. The generation of oxygen plasma 1256 can be controlled to limit the diffusion of oxygen plasma 1256 within gate openings 412N-412P above the stack of nanostructured channel regions 120N-122P and prevent the diffusion of oxygen plasma 1256 into gate openings 412N between nanostructured channel regions 120N and into gate opening 412P between nanostructured channel regions 122P. Thus, portions of metallic layer 1236 within gate openings 412N-412P between nanostructured channel regions 120N-122P may not be oxidized and form glue layers 136N-136P. The generation of oxygen plasma 1256 can also be controlled to limit the diffusion of oxygen plasma 1256 above surface 136Na-136Pa within gate openings 412N-412P to prevent complete oxidation of metallic layer 1236 within gate openings 412N-412P above the stack of nanostructured channel regions 120N-122P. Thus, portions of metallic layer 1236 at the bottom of gate openings 412N-412P may not be oxidized and form glue layers 136N-136P.

The removal of metal oxide layer 1336 can include etching metal oxide layer 1336 with an etching gas tantalum chloride (TaCl$_5$) or WCl$_5$ at a temperature ranging from about 300° C. to about 500° C. and pressure ranging from about 5 torr to about 15 torr. Other temperature and pressure ranges are within the scope of the disclosure. In some embodiments, an atomic layer etching (ALE) process can be used to etch metal oxide layer 1336. The etching process can include sequential operations of (i) predicting an etching recipe for etching metal oxide layer 1336 using a control system (not shown), (ii) based on the predicted etching recipe, adjusting the process parameters of an etching apparatus (not shown) with the control system, (iii) based on the adjusted process parameters, etching metal oxide layer 1336 with the etching apparatus, (iv) measuring the thickness of metal oxide layer 1336 etched with a measurement system (not shown), (v) sending the measurement data of the etched thickness to the control system, (vi) analyzing the measurement data with the control system to determine if the etched thickness is equal to a desired value, and (vii) ending the etching process in the etching apparatus with the control system if the etched thickness is equal to the desired value or repeating operations (i)-(vi) until the etched thickness is equal to the desired value and the structures of FIGS. 14A-14B are formed. In some embodiments, the desired value can be the total thickness of metal oxide layer 1336. In some embodiments, the adjustment of the process parameters of the etching apparatus can include adjusting etching duration, etching gas flow, and/or etching temperature.

The prediction of the etching recipe with the control system can include performing a computing procedure to (i) analyze etching process data collected from previous etching processes performed on other structures with the etching apparatus and (ii) predict, based on the analyzed data, the etching process characteristics (e.g., etching rate, etching duration) for etching metal oxide layer 1336 with different etching process parameters (e.g., ampoule lifetime, temperature and humidity of etching chamber, light adsorption or reflection within the etching chamber, pressure within the etching chamber, carrier gas condition, etching gas supply pipe length, etc.). The computer procedure can include one or more mathematical operations, a pattern recognition procedure, a big data mining procedure, or a machine learning procedure, such as a neural network algorithm to analyze the etching process data (e.g., ampoule lifetime, etching chamber lifetime, effective etching density, effective etching area size, etching gas parameters, etc.) and predict the etching process characteristics. Similarly, the analysis of the measurement data with the control system can include performing a computing procedure.

Figures 16A, 16B:
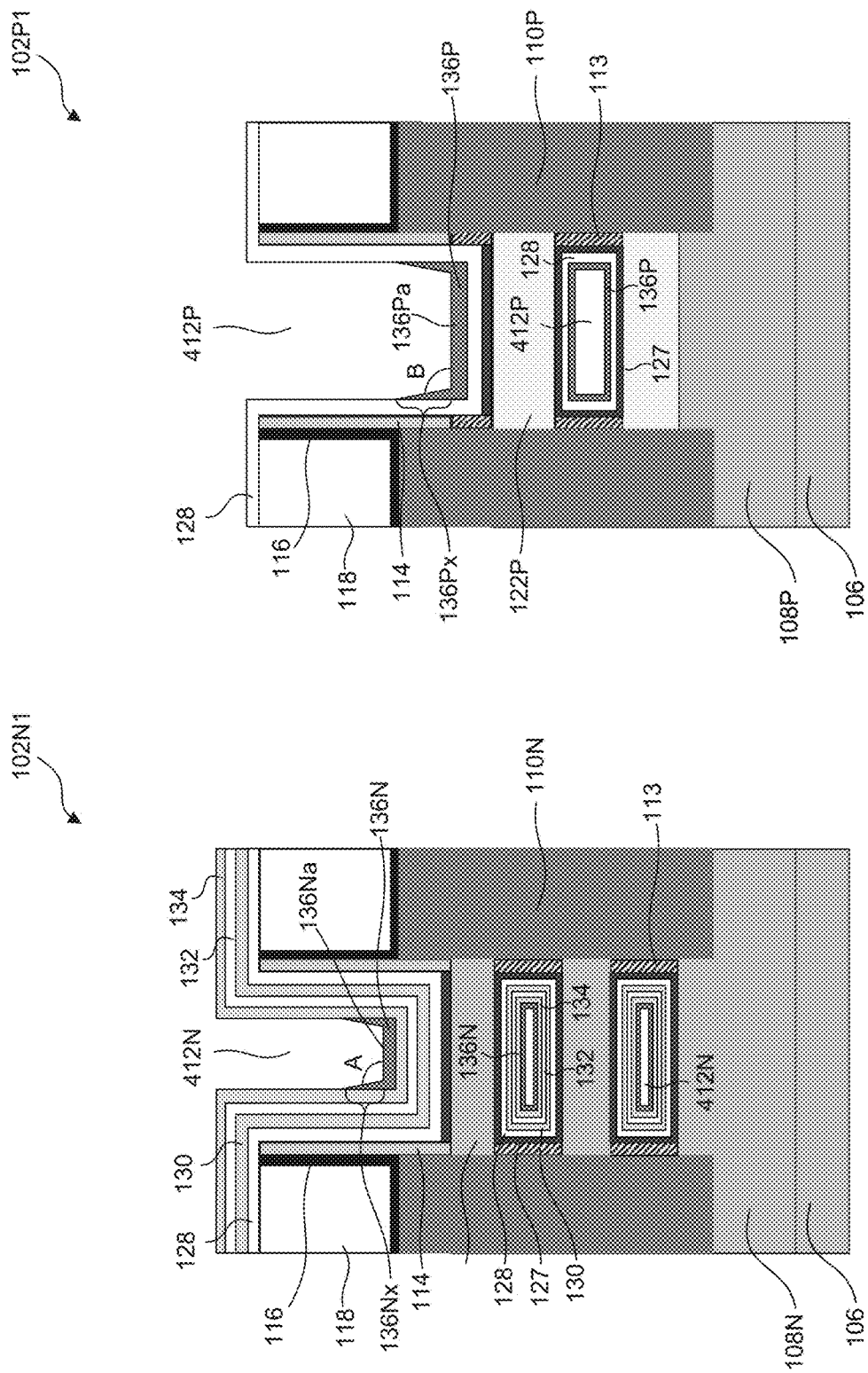

Referring to FIGS. 15A-16B, in some embodiments, portions of metallic layer 1236 along the sidewalls of gate openings 412N-412P may not be completely oxidized due to the diffusion control of oxygen plasma 1256 discussed above. As a result, extended portions 136Nx-136Px above surfaces 136Na-136Pa can be formed and the structures of FIGS. 16A-16B are formed after the removal of metal oxide layer from the structures of FIGS. 15A-15B. The structures of glue layers 136N-136P with extended portions 136Nx-136Px formed in FIGS. 16A-16B are described above with reference to FIGS. 1L-1O.

Figures 17A, 17B:
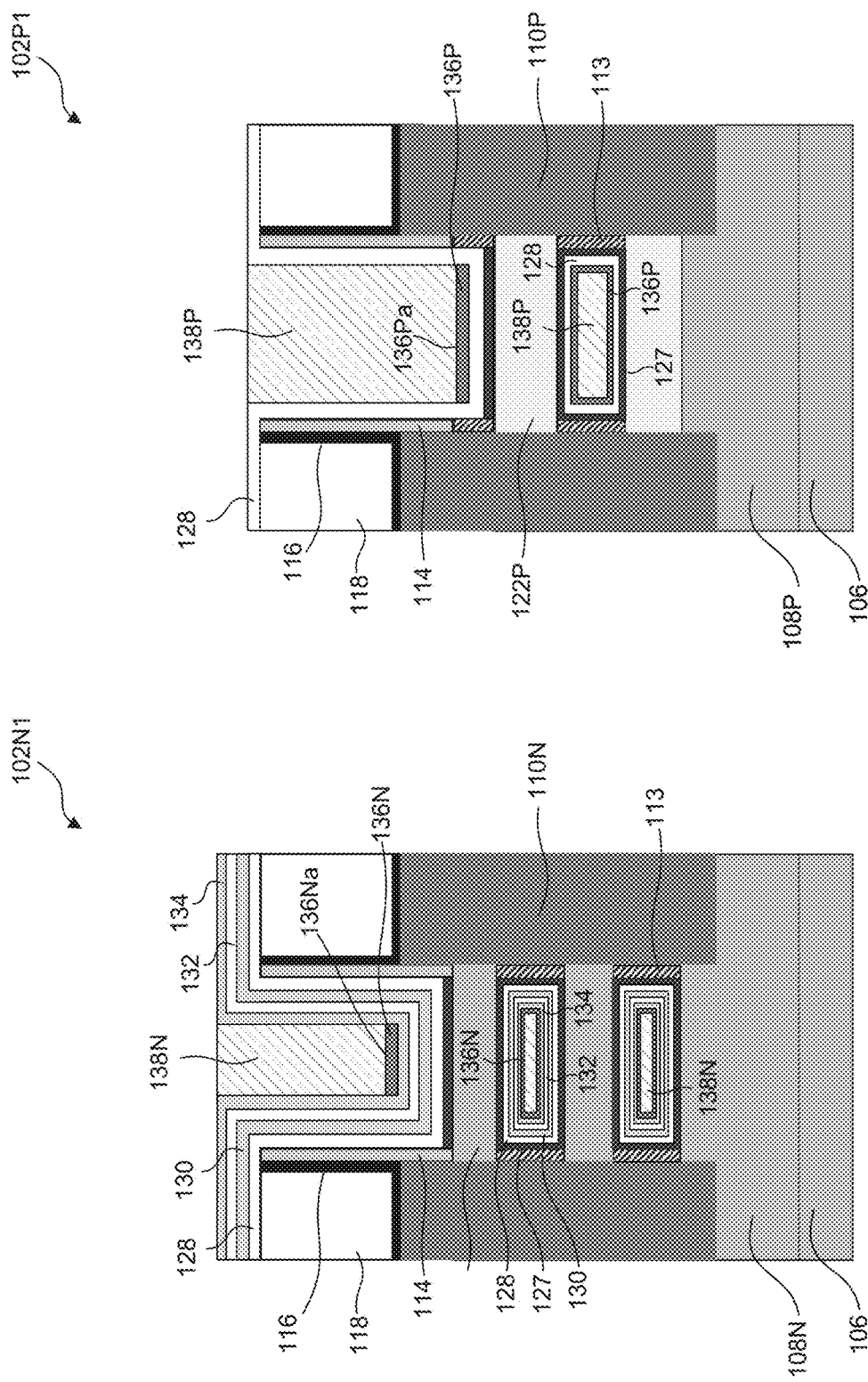

Referring to FIG. 2, in operation 235, gate metal fill layers are deposited on the glue layers. For example, as shown in FIGS. 17A-17B, gate metal fill layers 138N-138P are deposited on glue layers 136N-136P. The deposition of gate metal fill layers 138N-138P can include depositing a fluorine-free metal layer (e.g., a FFW layer) within gate openings 412N-412P of FIGS. 14A-14B at the same time. The deposition of the fluorine-free metal layer within gate openings 412N-412P above surfaces 316Na-316Pa can be a bottom-up deposition process, while the deposition of the fluorine-free metal layer within gate openings 412N-412P between nanostructured channel regions 120N-122P can be a conformal deposition process.

The deposition of the fluorine-free metal layer can include depositing the fluorine-free metal layer with an ALD process using $WCl_5$ or $WCl_6$ and $H_2$ as precursors at a temperature ranging from about 400° C. to about 500° C. Other temperature ranges are within the scope of the disclosure. In some embodiments, the fluorine-free metal layer can be deposited in an ALD process of about 160 cycles to about 320 cycles, where one cycle can include sequential periods of: (i) first precursor gas (e.g., $WCl_5$ or $WCl_6$) flow, (ii) a first gas purging process, (iii) a second precursor gas (e.g., H2) gas flow, and (iv) a second gas purging process.

Figure 18A:
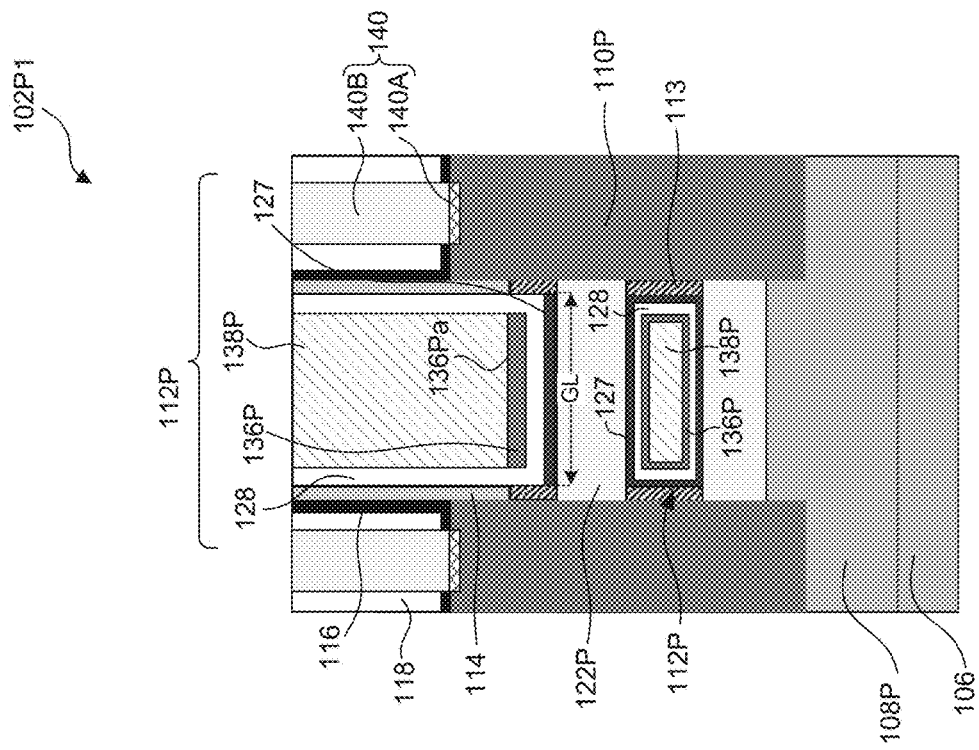
Figure 18B:
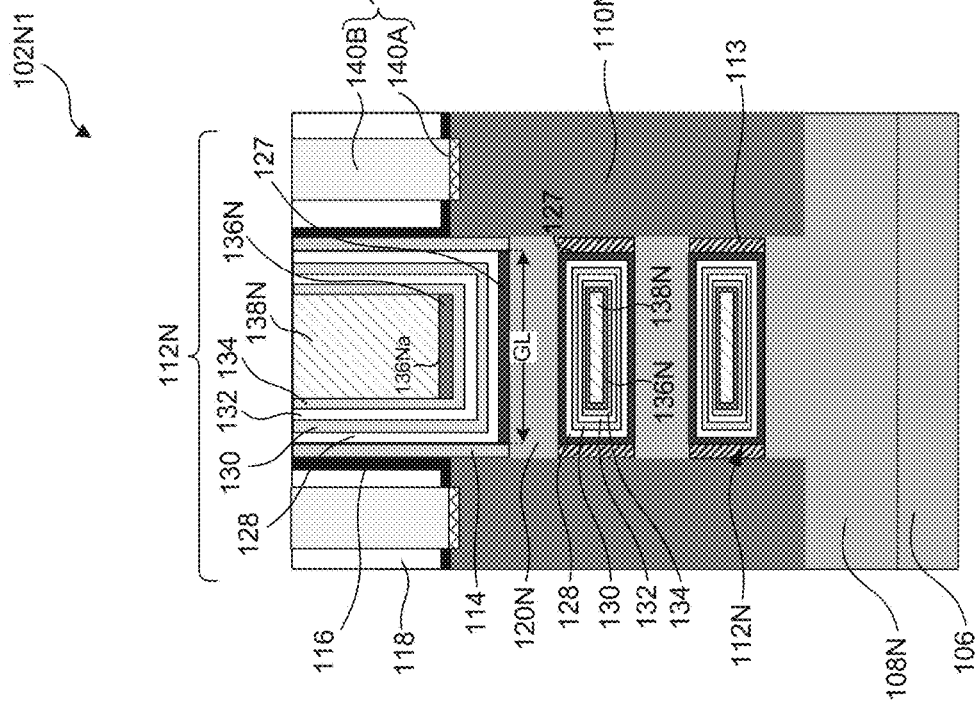

After the deposition of gate metal fill layers 138N-138P, HK gate dielectric layer 128, nWFM layer 130, adhesion layer 132, barrier layer 134, and gate metal fill layer 138N-138P can be polished by a chemical mechanical polishing (CMP) process to substantially coplanarize top surfaces of HK gate dielectric layer 128, nWFM layer 130, adhesion layer 132, barrier layer 134, and gate metal fill layer 138N-138P with a top surface of ILD layer 118, as shown in FIGS. 18A-18B. In some embodiments, after the CMP process, S/D contact structures 140 can be formed. The structures of FIGS. 18A-18B are described above with reference to FIGS. 1B-1E.

Figures 19A, 19B:
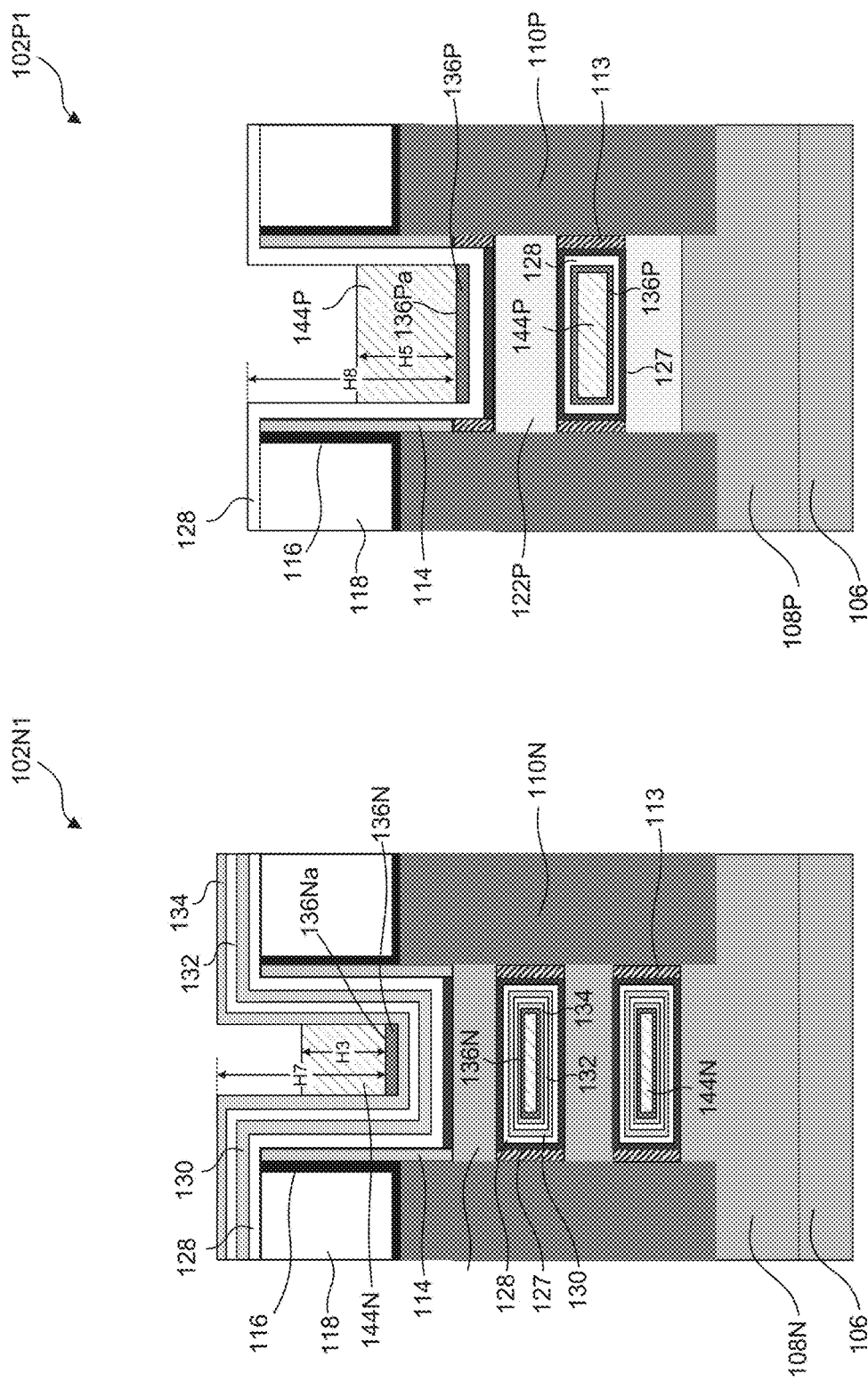
Figures 20A, 20B:
Figure 21B:
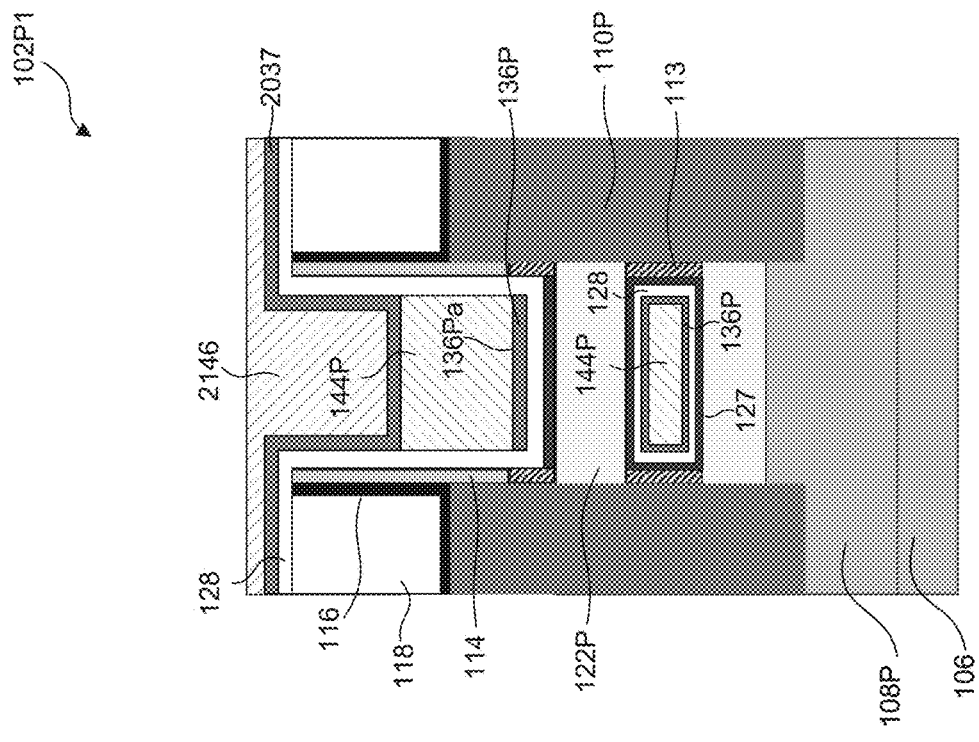
Figure 21A:
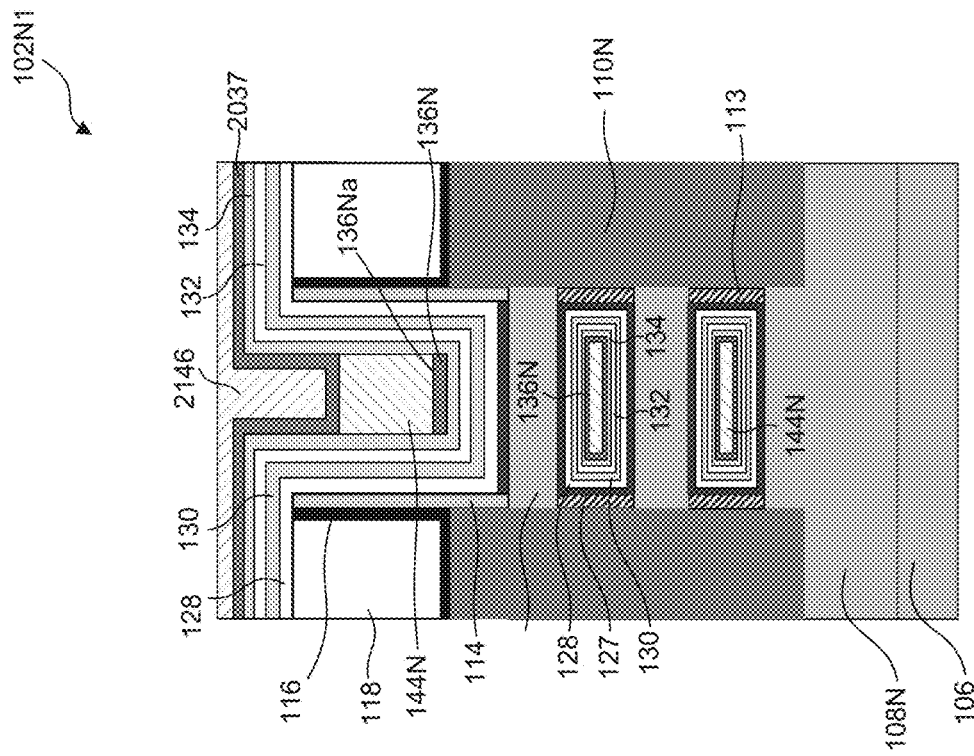

In some embodiments, in operation 235, instead of gate metal fill layers 138N-138P, gate metal fill layers 144N-146N and 144P-146P are deposited on glue layers 136N-136P, as described with reference to FIGS. 19A-21B. The formation of gate metal fill layers 144N-146N and 144P-146P can include sequential operations of (i) depositing gate metal fill layers 144N-144P of similar materials within gate openings 412N-412P of FIGS. 14A-14B at the same time, as shown in FIGS. 19A-19B, (ii) depositing a nitride layer 2037 on the structures of FIGS. 19A-19B, as shown in FIGS. 20A-20B, and (iii) depositing a metal layer 2146 on the structures of FIGS. 20A-20B, as shown in FIGS. 21A-21B.

The deposition of gate metal fill layers 144N-144P can include a deposition process similar to the deposition process of gate metal fill layers 138N-138P, described with reference to FIGS. 17A-17B. In some embodiments, gate metal fill layers 144N-144P can be deposited with heights of H3 and H5, as shown in FIGS. 19A-19B. Heights H3 can be about 75% to about 90% of height H7 and height H5 can be about 50% to about 75% of height H8. Heights H7-H8 are the heights of gate openings 412N-412P above surfaces 136Na-136Pa. In some embodiments, the deposition of nitride layer 2037 can include a deposition process similar to the deposition process of metallic layer 1236, described with reference to FIGS. 12A-12B. Nitride layer 2037 forms glue layers 137N-137P in subsequent processing.

Metal layer 2146 forms gate metal fill layers 146N-146P in subsequent processing. The deposition of metal layer 2146 can include depositing metal layer 2146 with a CVD process using $WF_6$ and $H_2$ as precursors at a temperature ranging from about 400° C. to about 500° C. Other temperature ranges are within the scope of the disclosure. The deposition rate of depositing metal layer 2146 can be higher than the deposition rate of depositing gate metal fill layers 144N-144P. The slower deposition rate for gate metal fill layers 144N-144P prevents the formation of voids in the difficult to fill regions of gate openings 412N-412P, such as corners and/or bottom of gate openings 412N-412P. And the faster deposition rate of metal layer 2146 for gate metal fill layers 146N-146P reduces processing time, and consequently, reduces manufacturing costs.

Figures 22A, 22B:
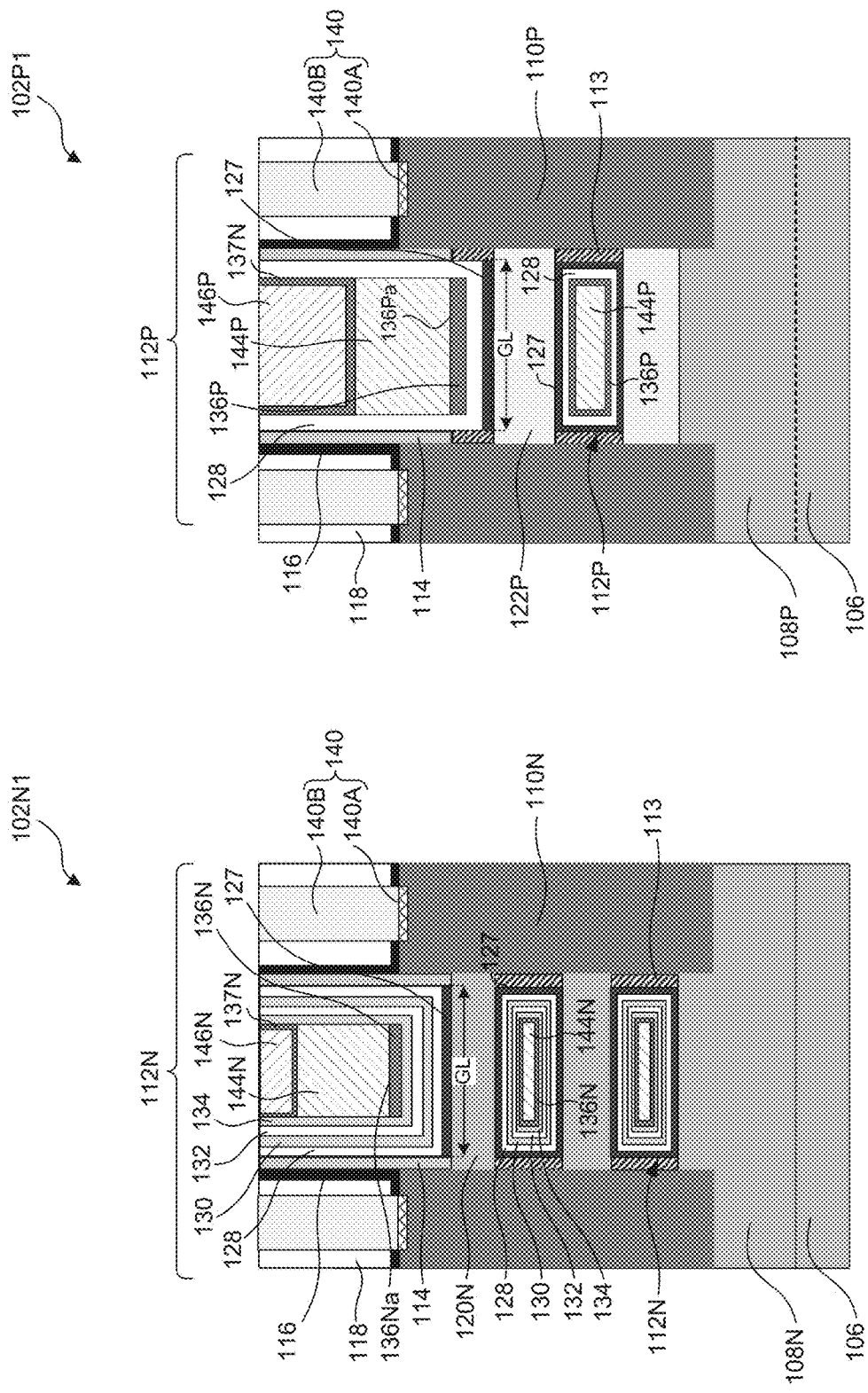

After the deposition of metal layer 2146, HK gate dielectric layer 128, nWFM layer 130, adhesion layer 132, barrier layer 134, nitride layer 2037, and metal layer 2146 can be polished by a CMP process to substantially coplanarize top surfaces of HK gate dielectric layer 128, nWFM layer 130, adhesion layer 132, barrier layer 134, nitride layer 2037, and of metal layer 2146 with a top surface of ILD layer 118, as shown in FIGS. 22A-22B. The structures of FIGS. 22A-22B are described above with reference to FIGS. 1F-1I.

Figures 23A, 23B:
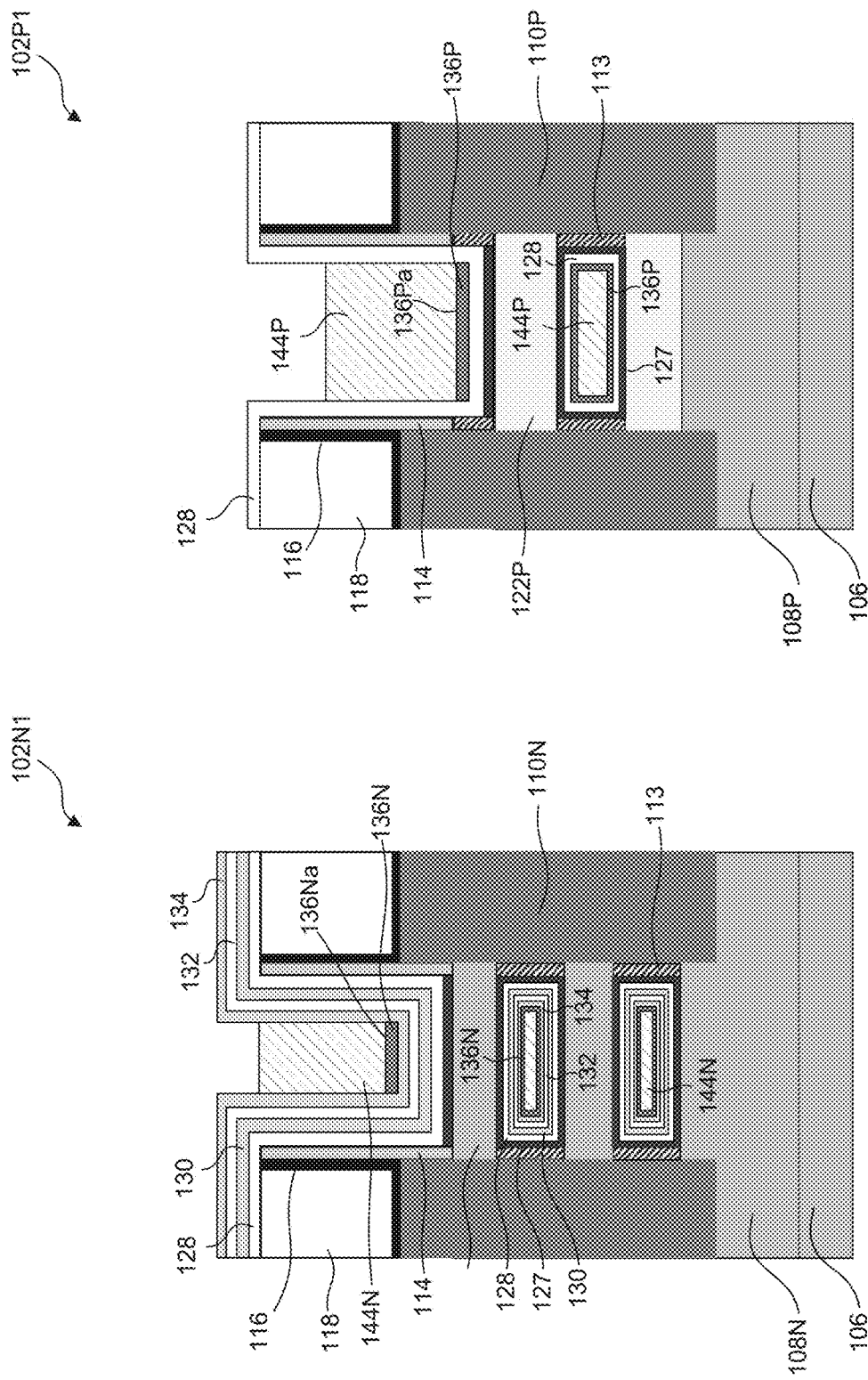

In some embodiments, in operation 235, instead of forming dual gate metal fill layers 144N-146N in gate structure 112N, single gate metal fill layer 144N or 138N can be formed in gate structure 112N and dual gate metal fill layers 144P-146P can be formed in gate structure 112P, as described with reference to FIGS. 23A-25B. The formation of single gate metal fill layer 144N and dual gate metal fill layers 144P-146P can include depositing gate metal fill layers 144N-144P within gate openings 412N-412P of FIGS. 14A-14B at the same time. The deposition process is performed until the top surface of gate metal fill layer 144N is substantially coplanar with the top surface of ILD layer 118, as shown in FIGS. 23A-23B. Due to gate opening 412P being larger than gate opening 412P, the top surface of gate metal fill layer 144P does not reach the top surface of ILD layer 118 at the same time as gate metal fill layer 144N, as shown in FIGS. 23A-23B.

Figures 25A, 25B:
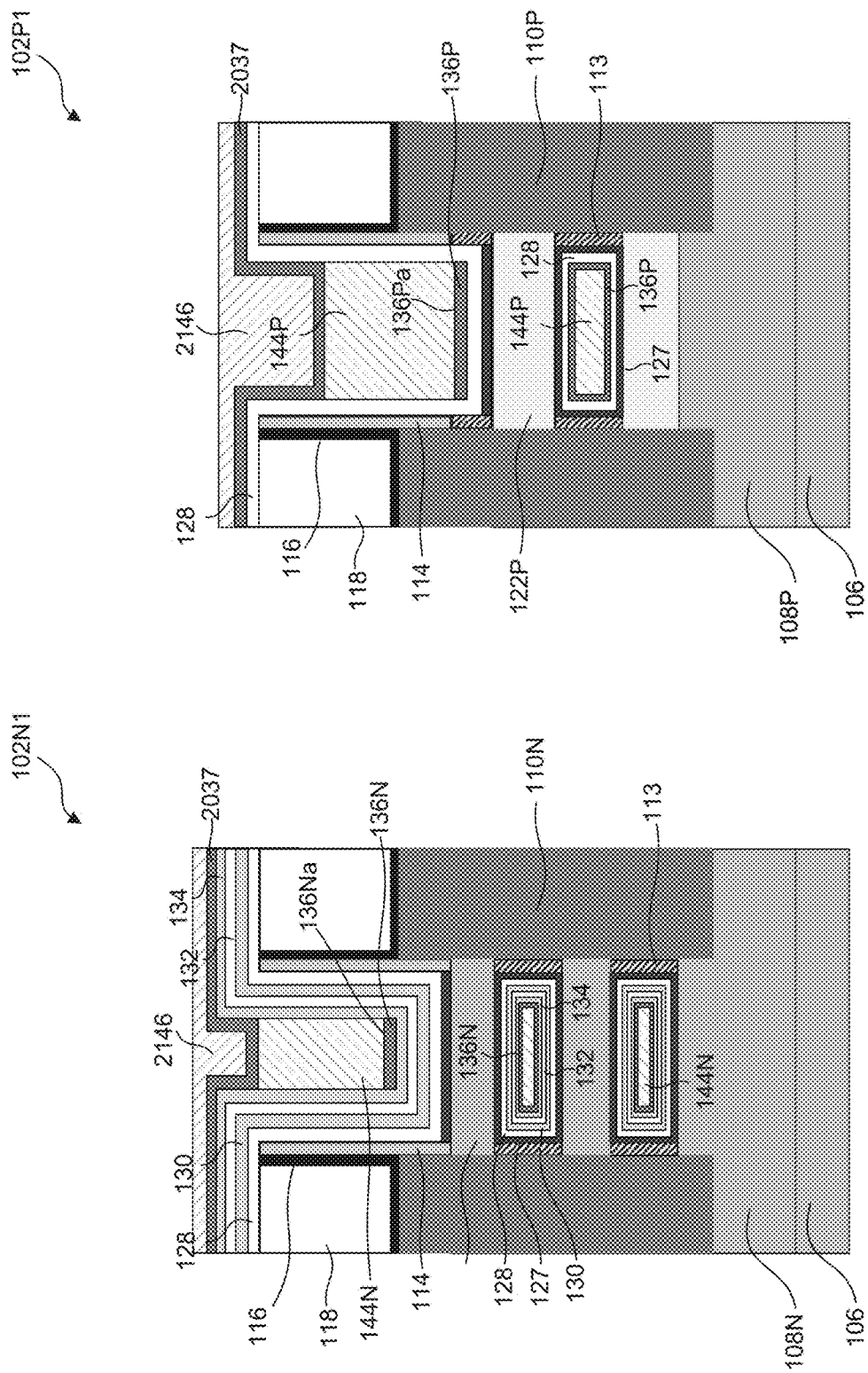
Figures 26A, 26B:
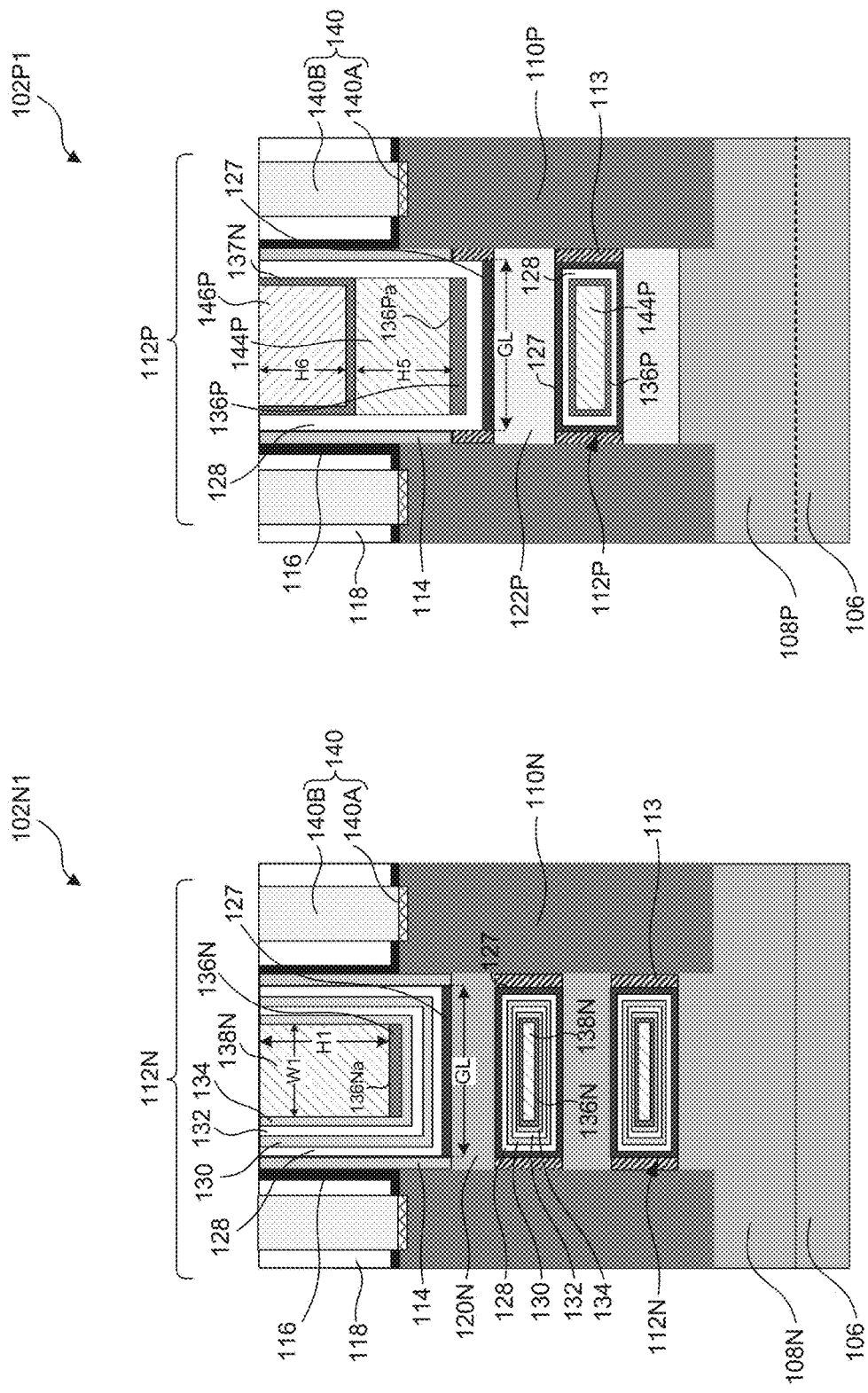

Following the deposition of gate metal fill layers 144N-144P, nitride layer 2037 can be deposited on the structures of FIGS. 23A-23B, as shown in FIGS. 24A-24B, and metal layer 2146 can be deposited on the structures of FIGS. 24A-24B, as shown in FIGS. 25A-25B. After the deposition of metal layer 2146, HK gate dielectric layer 128, nWFM layer 130, adhesion layer 132, barrier layer 134, nitride layer 2037, and metal layer 2146 can be polished by a CMP process to substantially coplanarize top surfaces of HK gate dielectric layer 128, nWFM layer 130, adhesion layer 132, barrier layer 134, nitride layer 2037, and of metal layer 2146 with a top surface of ILD layer 118, as shown in FIGS. 26A-26B. As portions of nitride layer 2037 and metal layer 2146 in gate structure 112N are deposited at a level above the top surface of ILD layer 118, these portions of nitride layer 2037 and metal layer 2146 are removed during the CMP process. As a result, single gate metal fill layer 144N is formed in gate structure 112.

Figure 27:
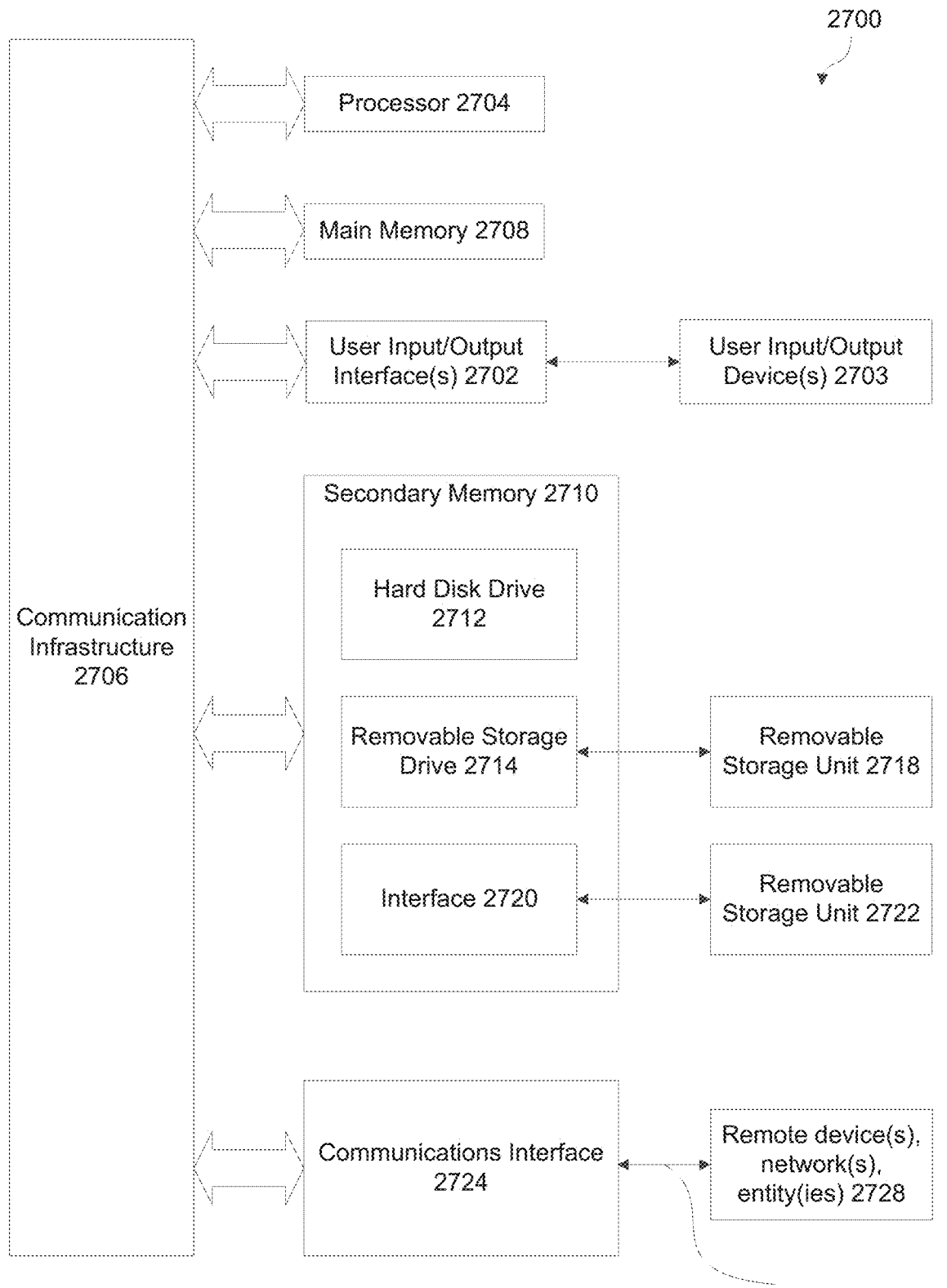
FIG. 27 illustrates a block diagram of a computer system for implementing various embodiments of the present disclosure, in accordance with some embodiments.

Various aspects of the exemplary embodiments may be implemented in software, firmware, hardware, or a combination thereof. FIG. 27 is an illustration of an example computer system 2700 in which embodiments of the present disclosure, or portions thereof, can be implemented as computer-readable code. Various embodiments of the present disclosure are described in terms of this example computer system 2700. For example, the control system discussed in operation 230 of method 200 can be incorporated as an embodiment of computer system 2700.

Computer system 2700 includes one or more processors, such as processor 2704. Processor 2704 is connected to a communication infrastructure 2706 (e.g., a bus or network).

Computer system 2700 also includes a main memory 2708, such as random access memory (RAM), and may also include a secondary memory 2710. Secondary memory 2710 can include, for example, a hard disk drive 2712, a removable storage drive 2714, and/or a memory stick. Removable storage drive 2714 can include a floppy disk drive, a magnetic tape drive, an optical disk drive, a flash memory, or the like. Removable storage drive 2714 reads from and/or writes to a removable storage unit 2718 in a well-known manner. Removable storage unit 2718 can include a floppy disk, magnetic tape, optical disk, flash drive, etc., which is read by and written to by removable storage drive 2714. Removable storage unit 2718 includes a computer-readable storage medium having stored therein computer software and/or data. Computer system 2700 includes a display interface 2702 (which can include input and output devices 2703, such as keyboards, mice, etc.) that forwards graphics, text, and other data from communication infrastructure 2706 (or from a frame buffer not shown).

In alternative implementations, secondary memory 2710 can include other similar devices for allowing computer programs or other instructions to be loaded into computer system 2700. Such devices can include, for example, a removable storage unit 2722 and an interface 2720. Examples of such devices include a program cartridge and cartridge interface (such as those found in video game devices), a removable memory chip (e.g., EPROM or PROM) and associated socket, and other removable storage units 2722 and interfaces 2720 which allow software and data to be transferred from the removable storage unit 2722 to computer system 2700.

Computer system 2700 can also include a communications interface 2724. Communications interface 2724 allows software and data to be transferred between computer system 2700 and external devices. Communications interface 2724 can include a modem, a network interface (such as an Ethernet card), a communications port, or the like. Software and data transferred via communications interface 2724 are in the form of signals which may be electronic, electromagnetic, optical, or other signals capable of being received by communications interface 2724. These signals are provided to communications interface 2724 via a communications path 2726. Communications path 2726 carries signals and can be implemented using wire or cable, fiber optics, a phone line, a cellular phone link, a RF link, or other communications channels.

In this document, the terms "computer program storage medium" and "computer-readable storage medium" are used to generally refer to non-transitory media such as removable storage unit 2718, removable storage unit 2722, and a hard disk installed in hard disk drive 2712. Computer program storage medium and computer-readable storage medium can also refer to memories, such as main memory 2708 and secondary memory 2710, which can be semiconductor memories (e.g., DRAMs, etc.). Embodiments of the present disclosure can employ any computer-readable medium, known now or in the future. Examples of computer-readable storage media include, but are not limited to, non-transitory primary storage devices (e.g., any type of random access memory), and non-transitory secondary storage devices (e.g., hard drives, floppy disks, CD ROMS, ZIP disks, tapes, magnetic storage devices, optical storage devices, MEMS, nanotechnological storage devices, etc.).

These computer program products provide software to computer system 2700. Embodiments of the present disclosure are also directed to computer program products including software stored on any computer-readable storage medium. Such software, when executed in one or more data processing devices, causes a data processing device(s) to operate as described herein.

Computer programs (also referred to herein as "computer control logic") are stored in main memory 2708 and/or secondary memory 2710. Computer programs may also be received via communications interface 2724. Such computer programs, when executed, enable computer system 2700 to implement various embodiments of the present disclosure. In particular, the computer programs, when executed, enable processor 2704 to implement processes of embodiments of the present disclosure, such as the operations in the methods illustrated by FIG. 4 in system 2700. Where embodiments of the present disclosure are implemented using software, the software can be stored in a computer program product and loaded into computer system 2700 using removable storage drive 2714, interface 2720, hard drive 2712, or communications interface 2724.

The functions/operations in the preceding embodiments can be implemented in a wide variety of configurations and architectures. Therefore, some or all of the operations in the preceding embodiments—e.g., the functions of control system discussed in operation 230 of method 200—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 2700, main memory 2708, secondary memory 2710 and removable storage units 2718 and 2722, as well as tangible articles of manufacture embodying any combination of the foregoing. Such control logic, when executed by one or more data processing devices (such as computer system 2700), causes such data processing devices to operate as described herein. For example, the hardware/equipment can be connected to or be part of element 2728 (remote device(s), network(s), entity(ies) 2728) of computer system 2700.

The present disclosure provides example multi-Vt devices (e.g., semiconductor device 100) with FETs (e.g., finFETs or GAA FETs) having different gate structure configurations (e.g., gate structures 112N-112P) that provide ultra-low threshold voltages different from each other without increasing gate resistance. The present disclosure also provides example methods of forming such FETs (e.g., NFET 102N1 and PFET 102P1) on a same substrate. The example methods form FETs of different conductivity types with different EWF values, and as a result, with different and/or ultra-low threshold voltages on the same substrate. These example methods can be more cost-effective (e.g., cost reduced by about 20% to about 30%) and time-efficient (e.g., time reduced by about 15% to about 20%) in manufacturing reliable gate structures in FETs with ultra-low threshold voltages than other methods of forming FETs with similar gate structure dimensions and threshold voltages on the same substrate. In addition, these example methods can form FET gate structures with smaller dimensions (e.g., smaller gate length) without increasing gate resistance than other methods of forming FETs with similar gate structure dimensions and threshold voltages. For example, using these example methods, the gate resistance can be reduced by about 50% to about 75% compared to the gate resistance of gate structures formed with similar gate structure dimensions and threshold voltages using the other methods.

In some embodiments, NFETs and PFETs with different gate structure configurations can be selectively formed on the same substrate. To achieve NFETs and PFETs with ultra-low threshold voltages, NFETs can include Al-based nWFM layers (e.g., nWFM layer 130) and PFETs can include substantially Al-free (e.g., with no Al) pWFM layers (e.g., glue layer 136P). The WFM layers can be in physical contact with gate dielectric layers of the NFETs and PFETs. In some embodiments, the nWFM layers can include Al-based titanium (Ti) or tantalum (Ta) alloys and the pWFM layers can include substantially Al-free (e.g., with no Al) Ti or Ta nitrides or alloys. In some embodiments, the pWFM layers can be used as WFM layers for the PFETs and also as glue layers for both the NFETs and PFETs to reduce the number of layers in the gate structures and consequently increase the volume area for gate metal fill layers (e.g., gate metal fill layers 138N-138P), which are formed on the glue layers. In some embodiments, the volume area for the gate metal fill layers can be further increased by removing the pWFM layers from the sidewalls of gate openings in which the gate metal fill layers are subsequently formed. Thus, the selective formation of the pWFM layers at the bottom of the NFET and PFET gate openings can form gate structures with ultra-low threshold voltages without increasing the gate resistance.

In some embodiments, a semiconductor device includes a substrate, first and second fin structures disposed on the substrate, first and second nanostructured channel regions disposed on the first and second fin structures, respectively, and first and second gate structures disposed on the first and second nanostructured channel regions, respectively. The first gate structure includes a nWFM layer disposed on the first nanostructured channel region, a barrier layer disposed on the nWFM layer, a first pWFM layer disposed on the barrier layer, and a first gate fill layer disposed on the first pWFM layer. Sidewalls of the first gate fill layer are in physical contact with the barrier layer. The second gate structure includes a gate dielectric layer disposed on the second nanostructured channel region, a second pWFM layer disposed on the gate dielectric layer, and a second gate fill layer disposed on the pWFM layer. Sidewalls of the second gate fill layer are in physical contact with the gate dielectric layer.

In some embodiments, a semiconductor device includes a substrate, a fin structure disposed on the substrate, a nanostructured channel region disposed on the fin structure, and a gate structure disposed on the nanostructured channel region. The gate structure includes a gate dielectric layer disposed on the nanostructured channel region, a first glue layer disposed on the gate dielectric layer, a first gate fill layer disposed on the first glue layer, a second glue layer disposed on the first gate fill layer, and a second gate fill layer disposed on the second glue layer. A volume area of the first gate fill layer is greater than a volume area of the second gate fill layer.

In some embodiments, a method includes forming a nanostructured channel region on a fin structure, forming a gate opening surround the nanostructured channel region, depositing an n-type work function metal (nWFM) layer within the gate opening, depositing a p-type work function metal (pWFM) layer over the nWFM layer, performing a plasma treatment on a portion of the pWFM layer, removing the portion of the pWFM layer, and depositing a gate metal fill layer within the gate opening.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate; and
   first and second gate structures disposed on the substrate, wherein the first gate structure comprises:
      a first work function metal (WFM) layer,
      a barrier layer disposed on the first WFM layer,
      a second WFM layer disposed on the barrier layer, and
      a first gate fill layer disposed on the second WFM layer, wherein vertical sidewalls of the first gate fill layer are in physical contact with the barrier layer, and
   wherein the second gate structure comprises:
      a gate dielectric layer,
      a third WFM layer disposed on the gate dielectric layer, and
      a second gate fill layer disposed on the third WFM layer, wherein vertical sidewalls of the second gate fill layer are in physical contact with the gate dielectric layer.

2. The semiconductor device of claim 1, wherein portions of the second WFM layer disposed on sidewalls of the barrier layer have a tapered profile.

3. The semiconductor device of claim 1, wherein a top surface of the second WFM layer is non-coplanar with top surfaces of the first WFM layer, the barrier layer, and the first gate fill layer.

4. The semiconductor device of claim 1, wherein portions of the third WFM layer disposed on sidewalls of the gate dielectric layer comprises a tapered profile.

5. The semiconductor device of claim 1, wherein a top surface of the third WFM layer is non-coplanar with a top surface of the gate dielectric layer.

6. The semiconductor device of claim 1, wherein a first sidewall portion of the first gate fill layer is in physical contact with the barrier layer and a second sidewall portion of the first gate fill layer is in physical contact with the second WFM layer.

7. The semiconductor device of claim 1, wherein a first sidewall portion of the second gate fill layer is in physical contact with the gate dielectric layer and a second sidewall portion of the second gate fill layer is in physical contact with the third WFM layer.

8. The semiconductor device of claim 1, wherein the second and third WFM layers comprise an Al-free metallic material.

9. The semiconductor device of claim 1, wherein the first gate structure further comprises a capping layer disposed between the first WFM layer and the barrier layer.

10. A semiconductor device, comprising:
a substrate; and
a gate structure disposed on the substrate, wherein the gate structure comprises:
a gate dielectric layer,
a first work function metal (WFM) layer disposed on the gate dielectric layer,
a first gate fill layer disposed on the first WFM layer,
a second WFM layer disposed on the first gate fill layer, and
a second gate fill layer disposed on the second WFM layer, and
wherein a volume area and a width of the first gate fill layer is greater than a volume area and a width of the second gate fill layer, respectively.

11. The semiconductor device of claim 10, wherein a ratio between a height of the first gate fill layer and a height of the second gate fill layer can range from about 2 to about 3.

12. The semiconductor device of claim 10, wherein the gate structure further comprises a third WFM layer disposed between the gate dielectric layer and the first WFM layer.

13. The semiconductor device of claim 10, wherein the gate structure further comprises a barrier layer disposed between the gate dielectric layer and the first WFM layer.

14. The semiconductor device of claim 10, wherein the first and second WFM layers comprise an Al-free metallic material.

15. A method, comprising:
forming a fin structure;
forming a gate opening on the fin structure;
depositing a first work function metal (WFM) layer in the gate opening;
depositing a barrier layer on the first WFM layer;
depositing a second WFM layer on the barrier layer;
performing a plasma treatment on a portion of the second WFM layer;
removing the portion of the second WFM layer to expose vertical sidewalls of the barrier layer; and
depositing a gate metal fill layer on the vertical sidewalls of the barrier layer.

16. The method of claim 15, wherein performing the plasma treatment on the portion of the second WFM layer comprises oxidizing the portion of the second WFM layer.

17. The method of claim 15, wherein removing the portion of the second WFM layer comprises etching the portion of the second WFM layer from sidewalls of the gate opening.

18. The method of claim 15, wherein depositing the gate metal fill layer comprises depositing a first gate metal fill layer in the gate opening and depositing a second gate metal fill layer on the first gate metal fill layer.

19. The method of claim 15, further comprising depositing a capping layer between the first WFM layer and the second WFM layer.

20. The method of claim 15, further comprising:
depositing a third WFM layer on the gate metal fill layer; and
depositing an other gate metal fill layer on the third WFM layer.

* * * * *